US012636685B2

(12) United States Patent
Endo et al.

(10) Patent No.: US 12,636,685 B2
(45) Date of Patent: May 26, 2026

(54) SUBSTRATE PROCESSING APPARATUS AND SUBSTRATE PROCESSING METHOD

(71) Applicant: SCREEN Holdings Co., Ltd., Kyoto (JP)

(72) Inventors: Toru Endo, Kyoto (JP); Takuji Kato, Kyoto (JP); Rikuta Aoki, Kyoto (JP); Yuta Yamanouchi, Kyoto (JP); Yutaka Ikegami, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 26 days.

(21) Appl. No.: 18/810,727

(22) Filed: Aug. 21, 2024

(65) Prior Publication Data

US 2025/0065378 A1     Feb. 27, 2025

(30) Foreign Application Priority Data

Aug. 24, 2023     (JP) ................................. 2023-136603

(51) Int. Cl.

| | |
|---|---|
| *B01D 12/00* | (2006.01) |
| *B08B 3/02* | (2006.01) |
| *B08B 5/02* | (2006.01) |
| *F26B 11/18* | (2006.01) |
| *F26B 21/40* | (2026.01) |
| *F26B 21/50* | (2026.01) |
| *H10P 72/00* | (2026.01) |

(52) U.S. Cl.
CPC .............. *B08B 3/024* (2013.01); *B01D 12/00* (2013.01); *B08B 5/02* (2013.01); *F26B 11/18* (2013.01); *F26B 21/40* (2026.01); *F26B 21/50* (2026.01); *H10P 72/0404* (2026.01); *H10P*

*72/0406* (2026.01); *H10P 72/0408* (2026.01); *H10P 72/0414* (2026.01)

(58) Field of Classification Search
None
See application file for complete search history.

(56) References Cited

U.S. PATENT DOCUMENTS

| | | | |
|---|---|---|---|
| 2016/0256901 A1 | 9/2016 | Kobayashi |
| 2017/0182515 A1 | 6/2017 | Emoto et al. |
| 2019/0088469 A1 | 3/2019 | Tanaka et al. |
| 2019/0148134 A1 | 5/2019 | Emoto et al. |

(Continued)

FOREIGN PATENT DOCUMENTS

| | | |
|---|---|---|
| JP | 2013-201334 A | 10/2013 |
| JP | 2016-167582 A | 9/2016 |

(Continued)

*Primary Examiner* — Levon J Shahinian
(74) *Attorney, Agent, or Firm* — Rimon P.C.

(57) ABSTRACT

A rinse liquid remaining on a substrate after a rinsing process is replaced with a replacement liquid having a surface tension lower than that of the rinse liquid. During this replacement, a nozzle device is arranged at a nozzle upper position higher than a processing cup. The nozzle device is moved from a center to an outer peripheral end of the substrate in a horizontal direction while downwardly discharging the replacement liquid. Thereafter, the substrate is dried. During this drying, the nozzle device is lowered from a position above the center of the substrate to a nozzle lower position close to the substrate while gas is downwardly injected from the nozzle device. Further, the nozzle device is moved in a horizontal direction from the center to the outer peripheral end of the substrate while injection of gas is continued.

10 Claims, 18 Drawing Sheets

(56)     References Cited

U.S. PATENT DOCUMENTS

| | | |
|---|---|---|
| 2019/0237322 A1 | 8/2019 | Okutani et al. |
| 2019/0366394 A1 | 12/2019 | Yoshida et al. |
| 2021/0031228 A1 | 2/2021 | Okutani et al. |
| 2022/0208563 A1 | 6/2022 | Negoro et al. |

FOREIGN PATENT DOCUMENTS

| | | |
|---|---|---|
| JP | 2017-118064 A | 6/2017 |
| JP | 2019-057625 A | 4/2019 |
| JP | 2019-134073 A | 8/2019 |
| JP | 2022-104307 A | 7/2022 |
| TW | 202105572 A | 2/2021 |

*FIG.3*

REPLACEMENT LIQUID
FIRST GAS
SECOND GAS
THIRD GAS

POINTS t2 TO t3 IN TIME

POINTS t3 TO t4 IN TIME

POINTS t4 TO t41 IN TIME

POINTS t41 TO t42 IN TIME

POINTS t42 TO t45 IN TIME

POINTS t5 IN TIME

POINTS t5 TO t51 IN TIME

POINT t51 IN TIME

POINTS t52 TO t53 IN TIME

POINT t54 IN TIME

POINTS t54 TO t55 IN TIME

SUBSTRATE PROCESSING APPARATUS AND SUBSTRATE PROCESSING METHOD

BACKGROUND

Technical Field

The present disclosure relates to a substrate processing apparatus and a substrate processing method for performing a predetermined process on a substrate.

Description of Related Art

A substrate processing apparatus is used to perform various processes on a substrate such as a semiconductor substrate, a substrate for an FPD (Flat Panel Display) that is used for a liquid crystal display device, an organic EL (Electro Luminescence) display device or the like, a substrate for an optical disc, a substrate for a magnetic disc, a substrate for a magneto-optical disc, a substrate for a photomask, a ceramic substrate or a substrate for a solar cell.

In a process of manufacturing a semiconductor device, a pattern of a photosensitive resist is formed on a substrate by using photolithography, for example. Various patterns such as wiring circuits are formed on the substrate by supply of a chemical liquid onto the substrate on which the photosensitive resist is formed (chemical liquid process).

A rinsing process is executed to stop the progress of the chemical liquid process and remove the chemical liquid remaining on the substrate after the pattern formation. In the rinsing process, a rinse liquid is supplied onto the substrate after the chemical liquid process. Thus, the chemical liquid on the substrate is replaced with the rinse liquid. Thereafter, a drying process of removing the rinse liquid remaining on the substrate is executed.

Various methods have been proposed to improve the cleanliness of the substrate after the drying process. For example, in order to suppress the generation of watermarks and the remaining of particles on the substrate, there is a method of supplying vapor of IPA (isopropyl alcohol) onto the rotating substrate after the rinsing process (see JP 2016-167582 A, for example).

The surface tension of IPA is lower than that of a pure water. Therefore, as described above, in a case in which IPA is used in the drying process for the substrate, damage of the pattern due to the IPA that has entered between patterns (collapse of patterns or the like) is reduced.

SUMMARY

In order to further improve the cleanliness of the substrate after the drying process and to further improve the reliability of various patterns formed on the substrate after the drying process, it is desirable that the residual liquid remaining on the substrate after the pattern formation is appropriately removed.

An object of the present disclosure is to provide a substrate processing apparatus and a substrate processing method that enable appropriate removal, from a substrate, of a residual liquid remaining on the substrate after pattern formation.

A substrate processing apparatus according to one aspect of the present disclosure that removes, from a substrate, a residual liquid remaining on the substrate after pattern formation, includes a substrate holder that holds and rotates the substrate about an axis extending in a vertical direction, a nozzle device having a liquid discharger, a first gas injector and a second gas injector, a fluid supply system that supplies a processing liquid having a surface tension lower than that of the residual liquid, a first gas and a second gas to the nozzle device, a relative movement device that moves the nozzle device having one attitude relative to the substrate between an upper position that is higher than the substrate held by the substrate holder by a predetermined distance and a lower position that is lower than the upper position and higher than the substrate, and moves the nozzle device having the one attitude in a horizontal direction relative to the substrate; and a controller, wherein the liquid discharger, with the nozzle device having the one attitude, is formed to downwardly discharge the processing liquid supplied from the fluid supply system, the first gas injector, with the nozzle device having the one attitude, is formed to downwardly inject the first gas supplied from the fluid supply system, the second gas injector, with the nozzle device having the one attitude and being arranged in a space above the substrate held by the substrate holder, is formed to radially inject the second gas supplied from the fluid supply system toward an outer peripheral end of the substrate in plan view, and the controller controls the substrate holder such that the substrate held by the substrate holder is rotated, executes liquid replacement control for controlling the fluid supply system and the relative movement device such that, with the residual liquid present on the substrate held by the substrate holder, the processing liquid is discharged onto the substrate from the liquid discharger of the nozzle device, after the liquid replacement control, executes first gas replacement control for controlling the relative movement device such that, with the processing liquid present on the substrate, the nozzle device is located at the upper position and the first gas injector is opposite to a center of the substrate, after the first gas replacement control, executes second gas replacement control for controlling the fluid supply system and the relative movement device such that the nozzle device is lowered from the upper position to the lower position while the first gas and the second gas are respectively injected from the first gas injector and the second gas injector, and after the second gas replacement control, executes the third gas replacement control for controlling the fluid supply system and the relative movement device such that the nozzle device located at the lower position is moved from a center toward the outer peripheral end of the substrate while the first gas and the second gas are respectively injected from the first gas injector and the second gas injector.

A substrate processing apparatus according to another aspect of the present disclosure that removes, from a substrate, a residual liquid remaining on the substrate after pattern formation, includes a substrate holder that holds and rotates the substrate about an axis extending in a vertical direction, a nozzle device having a liquid discharger, a first gas injector and a second gas injector, a fluid supply system that supplies a processing liquid having a surface tension lower than that of the residual liquid, a first gas and a second gas to the nozzle device, a relative movement device that moves the nozzle device having one attitude relative to the substrate between an upper position that is higher than the substrate held by the substrate holder by a predetermined distance and a lower position that is lower than the upper position and higher than the substrate, and moves the nozzle device having the one attitude in a horizontal direction relative to the substrate; and a controller, wherein the liquid discharger, with the nozzle device having the one attitude, is formed to downwardly discharge the processing liquid supplied from the fluid supply system, the first gas injector, with the nozzle device having the one attitude, is formed to downwardly inject the first gas supplied from the fluid supply system, the second gas injector, with the nozzle device having the one attitude and being arranged in a space above the substrate held by the substrate holder, is formed to radially inject the second gas supplied from the fluid supply system toward an outer peripheral end of the substrate in plan view, and the controller controls the substrate holder such that the substrate held by the substrate holder is rotated, executes first liquid replacement control for controlling the relative movement device such that, with the residual liquid present on the substrate held by the substrate holder, the nozzle device is located at the upper position and the liquid discharger is opposite to a center of the substrate, executes second liquid replacement control for controlling the fluid supply system and the relative movement device after the first liquid replacement control such that the nozzle device located at the upper position is moved from a center toward the outer peripheral end of the substrate while the processing liquid is discharged from the liquid discharger, and executes gas replacement control for controlling the fluid supply system and the relative movement device after the second liquid replacement control such that the first gas is injected onto the substrate from the first gas injector of the nozzle device while the second gas is injected from the second gas injector of the nozzle device, with the processing liquid present on the substrate held by the substrate holder.

A substrate processing method according to yet another aspect of the present disclosure of removing a residual liquid remaining on a substrate after pattern formation using a nozzle device, wherein the nozzle device has a liquid discharger, a first gas injector and a second gas injector, the liquid discharger, with the nozzle device having one attitude, is formed to downwardly discharge a processing liquid supplied to the nozzle device, the first gas injector, with the nozzle device having the one attitude, is formed to downwardly inject a first gas supplied to the nozzle device, the second gas injector, with the nozzle device having the one attitude and being arranged in a space above the substrate held by the substrate holder, is formed to radially inject a second gas supplied to the nozzle device toward an outer peripheral end of the substrate in plan view, the processing liquid has a surface tension lower than that of the residual liquid, and the substrate processing method includes holding the substrate using the substrate holder and rotating the held substrate about an axis extending in a vertical direction, a liquid replacement step of, with the residual liquid present on the substrate held by the substrate holder, discharging the processing liquid onto the substrate from the liquid discharger by arranging the nozzle device above the substrate and supplying the processing liquid to the nozzle device, a first gas replacement step of, after the liquid replacement step, arranging the nozzle device at an upper position higher than the substrate by a predetermined distance such that the first gas injector is opposite to a center of the substrate with the processing liquid present on the substrate, a second gas replacement step of, after the first gas replacement step, lowering the nozzle device to a lower position lower than the upper position and higher than the substrate while respectively injecting the first gas and the second gas from the first gas injector and the second gas injector by supplying the first gas and the second gas to the nozzle device, and a third gas replacement step of, after the second gas replacement step, moving the nozzle device located at the lower position from a center to the outer peripheral end of the substrate while respectively injecting the first gas and the second gas from the first gas injector and the second gas injector by supplying the first gas and the second gas to the nozzle device.

A substrate processing method according to yet another aspect of the present disclosure of removing a residual liquid remaining on a substrate after pattern formation from the substrate using a nozzle device, wherein the nozzle device has a liquid discharger, a first gas injector and a second gas injector, the liquid discharger, with the nozzle device having one attitude, is formed to downwardly discharge a processing liquid supplied to the nozzle device, the first gas injector, with the nozzle device having the one attitude, is formed to downwardly inject a first gas supplied to the nozzle device, the second gas injector, with the nozzle device having the one attitude and being arranged in a space above the substrate held by the substrate holder, is formed to radially inject a second gas supplied to the nozzle device toward an outer peripheral end of the substrate in plan view, the processing liquid has a surface tension lower than that of the residual liquid, and the substrate processing method includes holding the substrate using the substrate holder and rotating the held substrate about an axis extending in a vertical direction, a first liquid replacement step of arranging the nozzle device having the one attitude to an upper position higher than the substrate by a predetermined distance such that the liquid discharger is opposite to a center of the substrate with the residual liquid present on the substrate held by the substrate holder, a second liquid replacement step of, after the first liquid replacement step, moving the nozzle device located at the upper position from a center toward the outer peripheral end of the substrate while discharging the processing liquid from the liquid discharger by supplying the processing liquid to the nozzle device, and a gas replacement step of, after the second liquid replacement step, with the processing liquid present on the substrate, arranging the nozzle device above the substrate and injecting the first gas to the substrate from the first gas injector by supplying the first gas to the nozzle device while injecting the second gas from the second gas injector by supplying the second gas to the nozzle device.

With the present disclosure, it is possible to appropriately remove, from a substrate, a processing liquid remaining on the substrate after pattern formation.

Other features, elements, characteristics, and advantages of the present disclosure will become more apparent from the following description of preferred embodiments of the present disclosure with reference to the attached drawings.

BRIEF DESCRIPTION OF THE DRAWING

FIG. 3 is a schematic external perspective view of a nozzle device of FIG. 1;

DETAILED DESCRIPTION

A substrate processing apparatus and a substrate processing method according to one embodiment of the present disclosure will be described below with reference to the drawings. In the following description, a substrate refers to a substrate for an FPD (Flat Panel Display) that is used for a liquid crystal display device, an organic EL (Electro Luminescence) display device or the like, a semiconductor substrate, a substrate for an optical disc, a substrate for a magnetic disc, a substrate for a magneto-optical disc, a substrate for a photomask, a ceramic substrate, a substrate for a solar cell or the like. Further, an upper surface of the substrate refers to a surface of the substrate directed upwardly, and a lower surface of the substrate refers to a surface directed downwardly. The upper surface of the substrate may be a circuit forming surface (obverse surface), or the surface opposite to the circuit forming surface (back surface). Further, the substrate has a circular shape except for a notch in plan view.

Further, the substrate processing apparatus described below executes a chemical liquid process, a rinsing process and a drying process on a substrate to be processed. In the present embodiment, the chemical liquid process is a process of forming the structure of a predetermined pattern on the upper surface of the substrate by supplying a chemical liquid to the upper surface of the substrate. Further, the rinsing process is a process of washing the chemical liquid off the upper surface of the substrate by supplying a rinse liquid to the upper surface of the substrate after the chemical liquid process. Further, the drying process is a process of, by supplying a processing liquid having a surface tension lower than that of the rinse liquid to the upper surface of the substrate after the rinsing process, replacing the rinse liquid remaining on the substrate with the processing liquid and then drying the substrate. In the following description, the processing liquid used in the drying process, that is, the processing liquid having a surface tension lower than that of the rinse liquid is referred to as a replacement liquid.

1. Outline of Configuration of Substrate Processing Apparatus

Figure 1:
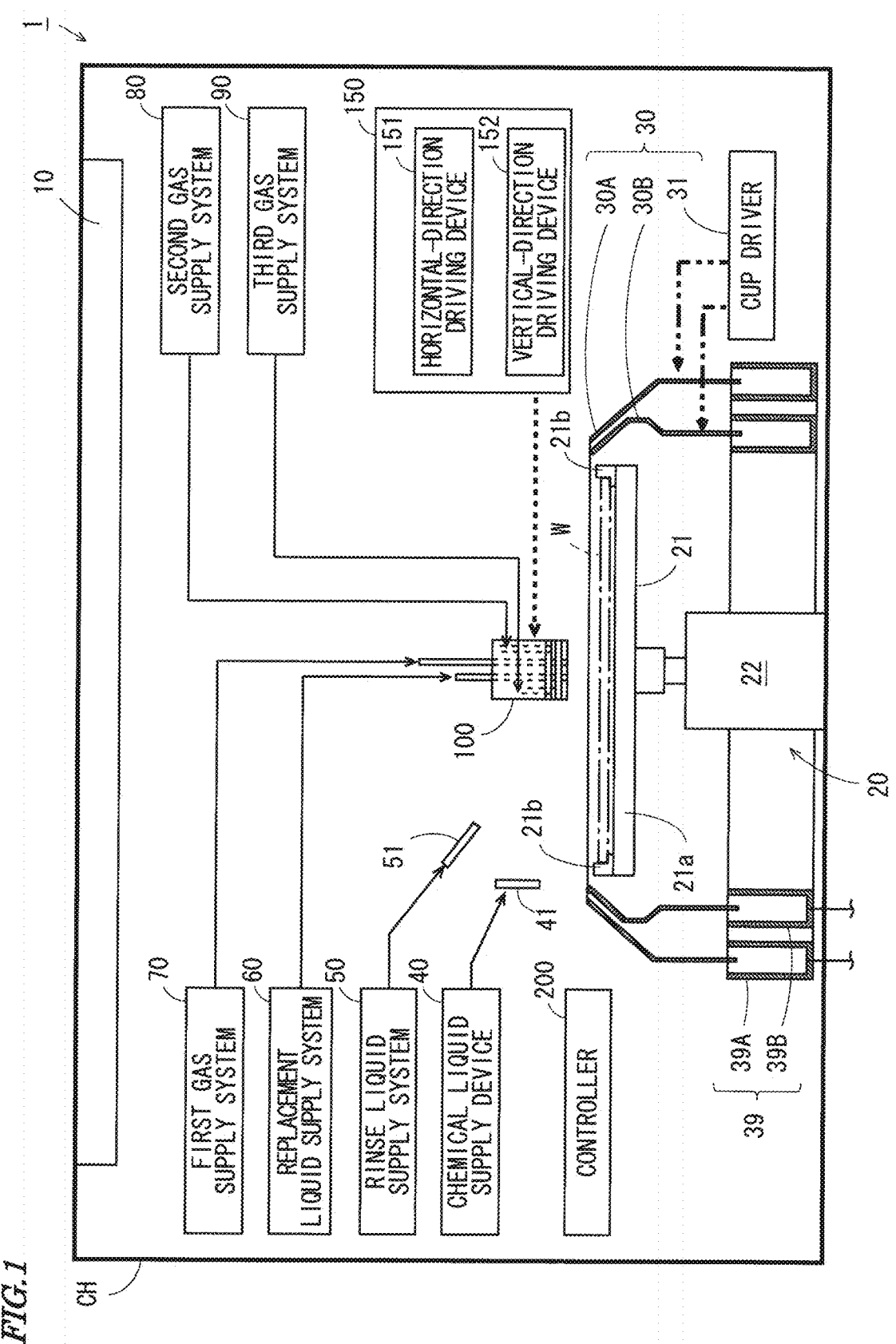
FIG. 1 is a schematic side view of a substrate processing apparatus according to one embodiment of the present disclosure.
Figure 2:
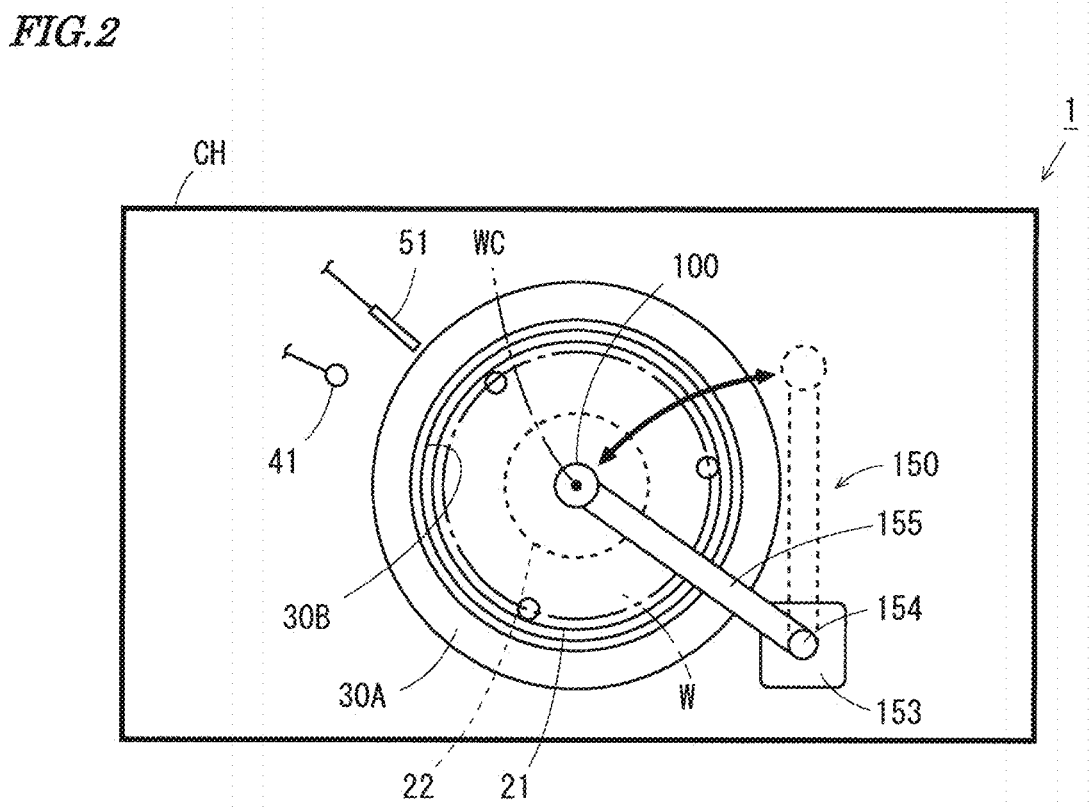
FIG. 2 is a schematic plan view showing the inner configuration of the substrate processing apparatus of FIG. 1.

FIG. 1 is a schematic side view of a substrate processing apparatus according to one embodiment of the present disclosure. FIG. 2 is a schematic plan view of the inner configuration of the substrate processing apparatus 1 of FIG. 1. FIG. 2 shows only part of a plurality of constituent elements of the substrate processing apparatus 1 of FIG. 1. As shown in FIG. 1, the substrate processing apparatus 1 includes a substrate holding device 20, a cup device 30, a liquid drain device 39, a chemical liquid supply device 40, a rinse liquid supply system 50 and a replacement liquid supply system 60. Further, the substrate processing apparatus 1 includes a first gas supply system 70, a second gas supply system 80, a third gas supply system 90, a nozzle device 100, a nozzle movement device 150 and a controller 200.

Further, the substrate processing apparatus 1 includes a chamber CH that accommodates the above-mentioned respective constituent elements. The chamber CH has four side surface portions, a ceiling portion and a bottom portion. In one side surface portion of the chamber CH, a transfer opening (not shown) for transferring a substrate between the inside of the chamber CH and the outside of the chamber CH is formed. Further, a filter fan unit (FFU) 10 is provided in the ceiling portion of the chamber CH. In the chamber CH, the FFU 10 generates a downward flow of clean air.

The substrate holding device 20 is provided at substantially the center of the bottom portion of the chamber CH. The substrate holding device 20 includes a substrate holder 21 and a rotation driver 22. The rotation driver 22 is a motor, for example, and is fixed to the bottom portion of the chamber CH. The rotation driver 22 has a rotation shaft extending upwardly. The substrate holder 21 is connected to the upper end portion of the rotation shaft.

The substrate holder 21 is a so-called mechanical chuck-type spin chuck that holds the outer peripheral end of the substrate W. Specifically, the substrate holder 21 includes a disc-shaped spin base 21*a* and a plurality of rotary holding pins 21*b* provided on the peripheral portion of the upper surface of the spin base 21*a*. In the substrate holder 21, the peripheral portion of the lower surface and the outer peripheral end of the substrate W arranged on the spin base 21*a* are held by the plurality of holding pins 21*b*. In this state, the rotation driver 22 operates to rotate the substrate W in a horizontal attitude. In FIGS. 1 and 2, the substrate W held by the substrate holding device 20 is indicated by the one-dot and dash lines.

The chemical liquid process, the rinsing process and the drying process, described above, are executed when various processing liquids are supplied to the upper surface of the substrate W held and rotated by the substrate holding device 20. The cup device 30 and the liquid drain device 39 are used to discard a processing liquid splashed from the rotating substrate W during each process.

The cup device 30 includes an outer cup 30A, an inner cup 30B and a cup driver 31. Each of the outer cup 30A and the inner cup 30B has a substantially cylindrical shape, and is provided to surround the substrate holder 21 in plan view (FIG. 2) and extend in a vertical direction. The inner diameter of the outer cup 30A is larger than the outer diameter of the inner cup 30B. Therefore, the inner cup 30B is arranged inside of the outer cup 30A. Further, each of the outer cup 30A and the inner cup 30B is provided to be movable in the vertical direction.

The cup driver 31 includes an actuator such as a motor or an air cylinder. The cup driver 31 moves each of the outer cup 30A and the inner cup 30B between a predetermined cup upper position and a predetermined cup lower position in accordance with a process executed on the substrate W.

The cup upper position of each of the cups 30A, 30B is the height position (position in the vertical direction) at which the upper end portion of the cup is higher than the substrate W held by the substrate holder 21. Thus, each cup receives the processing liquid splashed from the substrate W while being located at the cup upper position. On the other hand, the cup lower position of each of the cups 30A, 30B is the height position at which the upper end portion of the cup is lower than the substrate W held by the substrate holder 21. In the present embodiment, the cup upper position of the outer cup 30A and the cup upper position of the inner cup 30B are the same. Further, the cup lower position of the outer cup 30A and the cup lower position of the inner cup 30B are the same.

The liquid drain device 39 includes an outer container 39A and an inner container 39B respectively corresponding to the outer cup 30A and the inner cup 30B. Each of the outer container 39A and the inner container 39B has an annular groove opening upwardly, and guides the processing liquid received by the corresponding cup to a disposal facility in a factory.

A chemical liquid nozzle 41 is provided in the chamber CH. The chemical liquid supply device 40 includes a chemical liquid supply system and a chemical liquid nozzle movement device (not shown). The chemical liquid nozzle 41 is supported by the chemical liquid nozzle movement device. During the chemical liquid process for the substrate W, the chemical liquid nozzle movement device moves the chemical liquid nozzle 41 between a processing position above the center WC (FIG. 2) of the substrate W held by the substrate holder 21 and a waiting position sideward of the substrate W. During the chemical liquid process for the substrate W, the chemical liquid supply system of the chemical liquid supply device 40 supplies a chemical liquid to the chemical liquid nozzle 41 being located at the processing position. Thus, the chemical liquid is supplied to the upper surface of the rotating substrate W held by the substrate holder 21.

As the chemical liquid, hydrofluoric acid (HF), a sulfuric acid-hydrogen peroxide mixture (SPM), an ammonia-hydrogen peroxide mixture (SC1), a hydrochloric acid-hydrogen peroxide mixture (SC2), dilute hydrofluoric acid (DHF), an organic alkali (tetramethylammonium hydroxide (TMAH), for example), buffered hydrofluoric acid (BHF) or the like, is used.

In the chamber CH, a rinse liquid nozzle 51 is further provided at a predetermined position higher than the substrate holding device 20 and the cup device 30. The rinse liquid nozzle 51 is fixed such that its discharge port is directed to the center WC of the substrate W held by the substrate holder 21. During the rinsing process for the substrate W, the rinse liquid supply system 50 supplies a rinse liquid to the rinse liquid nozzle 51. Thus, the rinse liquid is supplied to the upper surface of the rotating substrate W held by the substrate holder 21.

As the rinsing liquid, a pure water (deionized water), a carbonated water, an ozonated water, a magnetic water, an ultra-dilute ammonium water (not less than 1 ppm and not more than 100 ppm), an ultra-dilute hydrochloric acid water (not less than 1 ppm and not more than 100 ppm), a kangen water (hydrogen water), an ionized water or the like.

The nozzle device 100 is supported by the nozzle movement device 150 in the chamber CH. As shown in FIG. 2, the nozzle movement device 150 includes a base portion 153, a support shaft 154 and an arm 155. The base portion 153 is fixed to the bottom portion of the chamber CH so as to be located outwardly of the outer cup 30A in plan view. The support shaft 154 is provided so as to extend upwardly from the base portion 153 by a certain distance. An arm 155 extending in a horizontal direction is attached to the upper end portion of the support shaft 154. The nozzle device 100 is attached to the tip portion of the arm 155.

As shown in FIG. 1, the nozzle movement device 150 further includes a horizontal-direction driving device 151 and a vertical-direction driving device 152. Each of the horizontal-direction driving device 151 and the vertical-direction driving device 152 is built in the base portion 153 of FIG. 2, for example, and includes an actuator such as a motor or an air cylinder.

The horizontal-direction driving device 151 rotates the support shaft 154 about the axis of the support shaft 154. In this case, during the drying process for the substrate W, the horizontal-direction driving device 151 moves the nozzle device 100 in an arc shape in plan view between the space above the substrate W held by the substrate holder 21 and the waiting position sideward of the substrate W (see the thick solid arrow in FIG. 2).

Further, the vertical-direction driving device 152 moves the support shaft 154 in the vertical direction. Thus, during the drying process for the substrate W, the horizontal-direction driving device 151 moves the nozzle device 100 between the nozzle upper position and the nozzle lower position in the space above the substrate W held by the substrate holder 21.

In the following description, the height position of the nozzle device 100 means the height position of the lower end portion of the nozzle device 100. The nozzle upper position is the height position higher than the cup upper position of each of the cups 30A, 30B and higher than the substrate W held by the substrate holder 21 by a predetermined distance (about 30 mm, for example). The nozzle lower position is the height position lower than the nozzle upper position and higher than the substrate W held by the substrate holder 21.

During the drying process for the substrate W, the replacement liquid supply system 60, the first gas supply system 70, the second gas supply system 80 and the third gas supply system 90 respectively supply the replacement liquid, a first gas, a second gas and a third gas to the nozzle device 100.

As described above, the replacement liquid is a processing liquid having a surface tension lower than that of the rinse liquid used in the rinsing process executed immediately before the drying process. An organic solvent is used as such a processing liquid. In the present embodiment, IPA (isopropyl alcohol) is used as the replacement liquid. As the replacement liquid, instead of IPA, other organic solvents such as hydrofluoroether (HFE), methanol, ethanol or acetone may be used. Further, the replacement liquid may be a liquid mixture of an organic solvent and a pure water.

In the present embodiment, the first gas, the second gas and the third gas are a nitrogen gas. Note that the first gas, the second gas and the third gas are only required to be an inert gas. An argon gas, a helium gas or the like can be used instead of a nitrogen gas. Further, the first gas, the second gas and the third gas may be an inert gas of the same type, or at least one of the gases may be an inert gas having the type different from the types of the other gases.

2. Configuration of Nozzle Device 100

Figure 3:
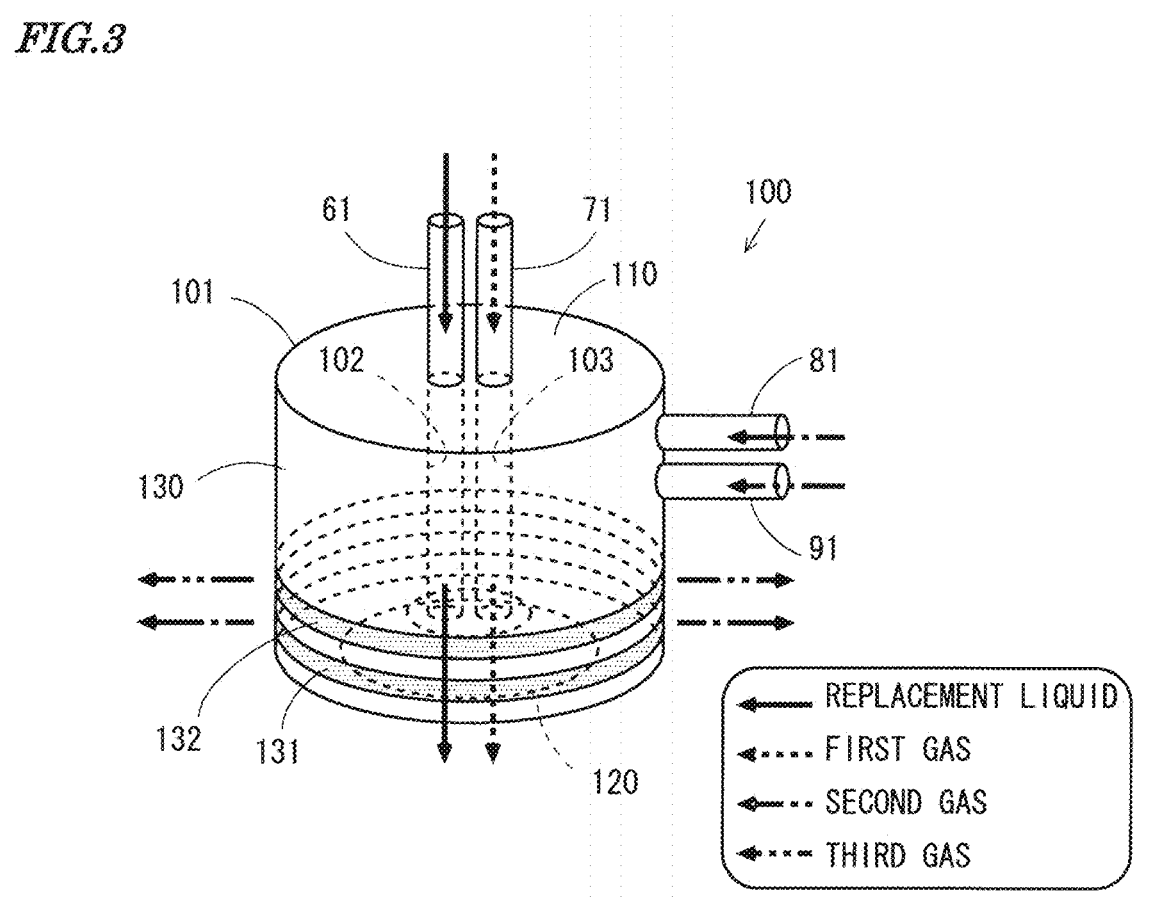
Figure 4:
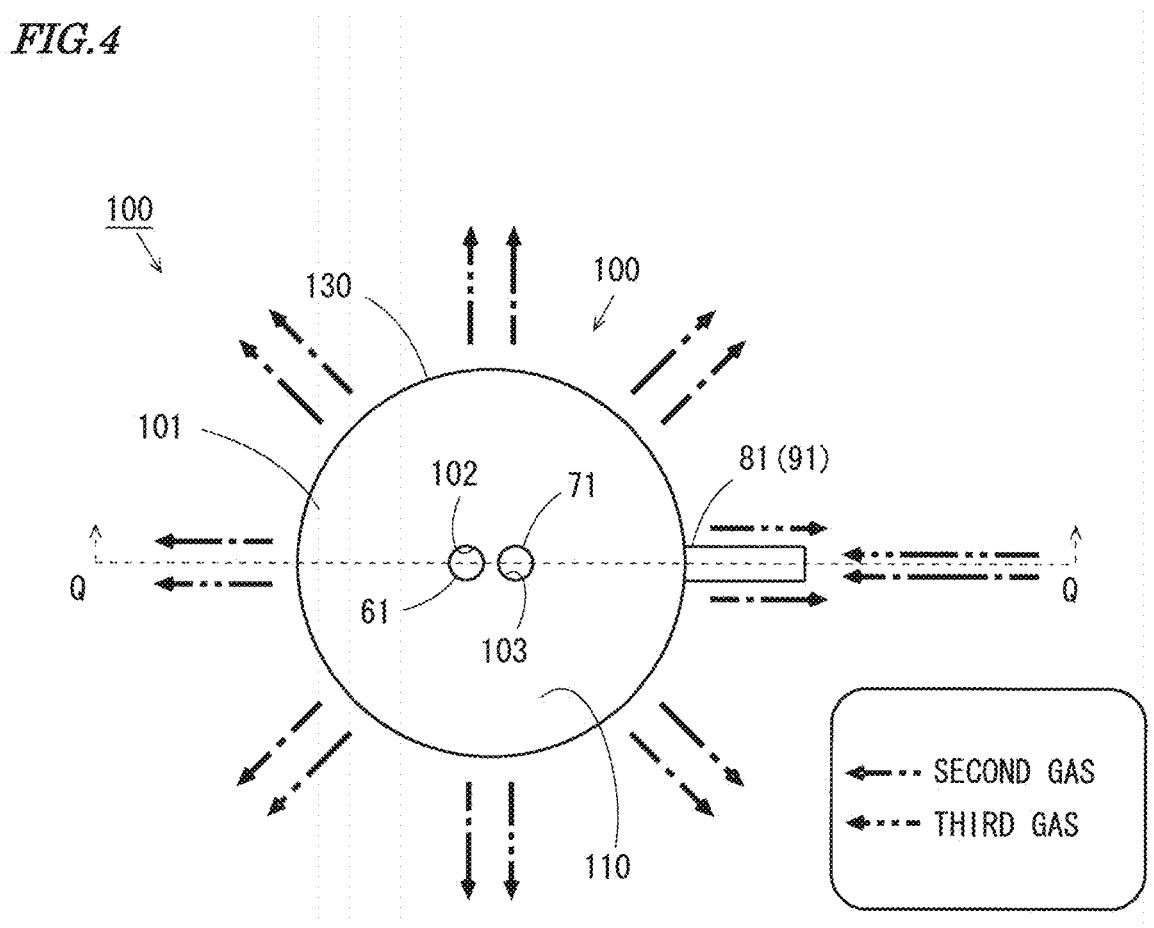
FIG. 4 is a schematic plan view of the nozzle device of FIG. 1.
Figure 5:
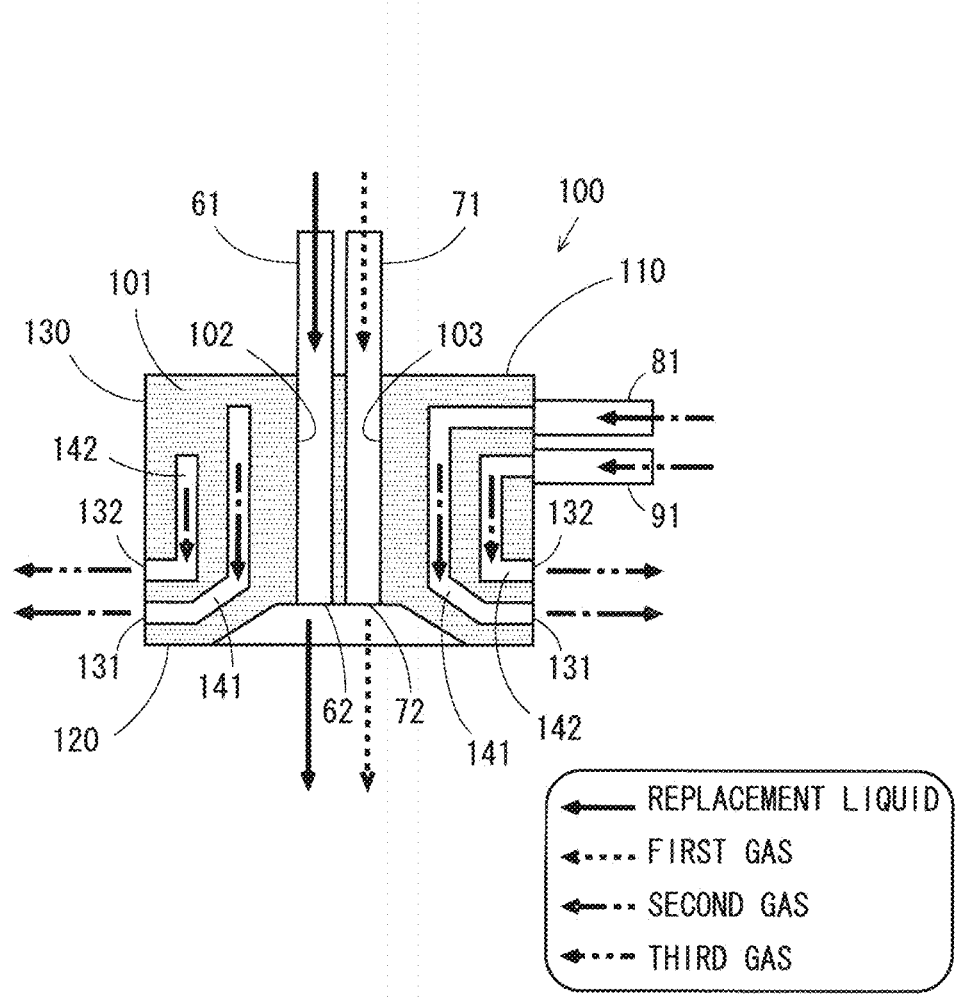
FIG. 5 is a longitudinal cross-sectional view of the nozzle device of FIG. 4 taken along the line Q-Q.

The configuration of the nozzle device 100 will be described. FIG. 3 is a schematic external perspective view of the nozzle device 100 of FIG. 1, FIG. 4 is a schematic plan view of the nozzle device 100 of FIG. 1, and FIG. 5 is a longitudinal cross-sectional view of the nozzle device 100 of FIG. 4 taken along the line Q-Q.

As shown in FIG. 3, the nozzle device 100 includes a nozzle body 101 having a substantially columnar shape. In the substrate processing apparatus 1, the nozzle device 100 is supported by the nozzle movement device 150 having one attitude in which the axial center (center axis) of the nozzle body 101 extends in the vertical direction.

The nozzle body 101 has an upper surface 110, a lower surface 120 and an outer peripheral surface 130. The upper surface 110 has a circular shape and is directed upwardly with the nozzle device 100 having the one attitude. The lower surface 120 has a circular shape and is directed downwardly with the nozzle device 100 having the one attitude. The center portion of the lower surface 120 is recessed in a mortar shape. The outer peripheral surface 130 is a cylindrical surface connecting the outer edge of the upper surface 110 to the outer edge of the lower surface 120.

In the nozzle body 101, two through holes 102, 103 are formed so as to extend in the vertical direction along the axial center of the nozzle body 101 and be close to each other. A replacement liquid pipe 61 forming part of the replacement liquid supply system 60 of FIG. 1 is inserted into the one through hole 102. A first gas pipe 71 forming part of the first gas supply system 70 of FIG. 1 is inserted into the other through hole 103.

As shown in FIG. 5, with the replacement liquid pipe 61 being inserted into the through hole 102, the tip portion of the replacement liquid pipe 61 is located in the lower end portion of the nozzle device 100 and functions as a replacement liquid discharge port 62 that downwardly discharges the replacement liquid. On the other hand, with the first gas pipe 71 being inserted into the through hole 103, the tip portion of the first gas pipe 71 is located in the lower end portion of the nozzle device 100 and functions as a first gas injection port 72 that downwardly injects the first gas. In FIGS. 3 and 5, a flow of the replacement liquid discharged from the nozzle device 100 through the replacement liquid pipe 61 is indicated by the thick solid arrows. Further, a flow of the first gas injected from the nozzle device 100 through the first gas pipe 71 is indicated by the thick dotted arrows.

As shown in FIG. 3, in the vicinity of the lower end portion of the outer peripheral surface 130 of the nozzle body 101, a second gas injection port 131 and a third gas injection port 132 extending in a circumferential direction are formed in an annular shape over the entire circumference of the outer peripheral surface 130. The third gas injection port 132 is located above the second gas injection port 131 and is close to the second gas injection port 131.

A second gas pipe 81 forming part of the second gas supply system 80 of FIG. 1 and a third gas pipe 91 forming part of the third gas supply system 90 of FIG. 1 are connected to the outer peripheral surface of the nozzle body 101.

As shown in FIG. 5, in the nozzle body 101, a gas flow path 141 guiding the second gas supplied from the second gas pipe 81 to the second gas injection port 131 is formed. Further, in the nozzle body 101, a gas flow path 142 that guides the third gas supplied from the third gas pipe 91 to the third gas injection port 132 is formed.

Thus, as indicated by the thick one-dot and dash arrows in each of FIGS. 3 to 5, when the second gas is supplied to the nozzle device 100, the second gas is injected from the second gas injection port 131 through the second gas pipe 81 and the gas flow path 141. A flow of the second gas injected from the second gas injection port 131 spreads radially in the direction orthogonal to the axial center of the nozzle body 101.

Thus, as indicated by the thick two-dot and dash arrows in each of FIGS. 3 to 5, when the third gas is supplied to the nozzle device 100, the third gas is injected from the third gas injection port 132 through the third gas pipe 91 and the gas flow path 142. Similarly to the flow of the second gas, a flow of the third gas injected from the third gas injection port 132 spreads radially in the direction orthogonal to the axial center of the nozzle body 101.

3. Control System of Substrate Processing Apparatus 1

Figure 6:
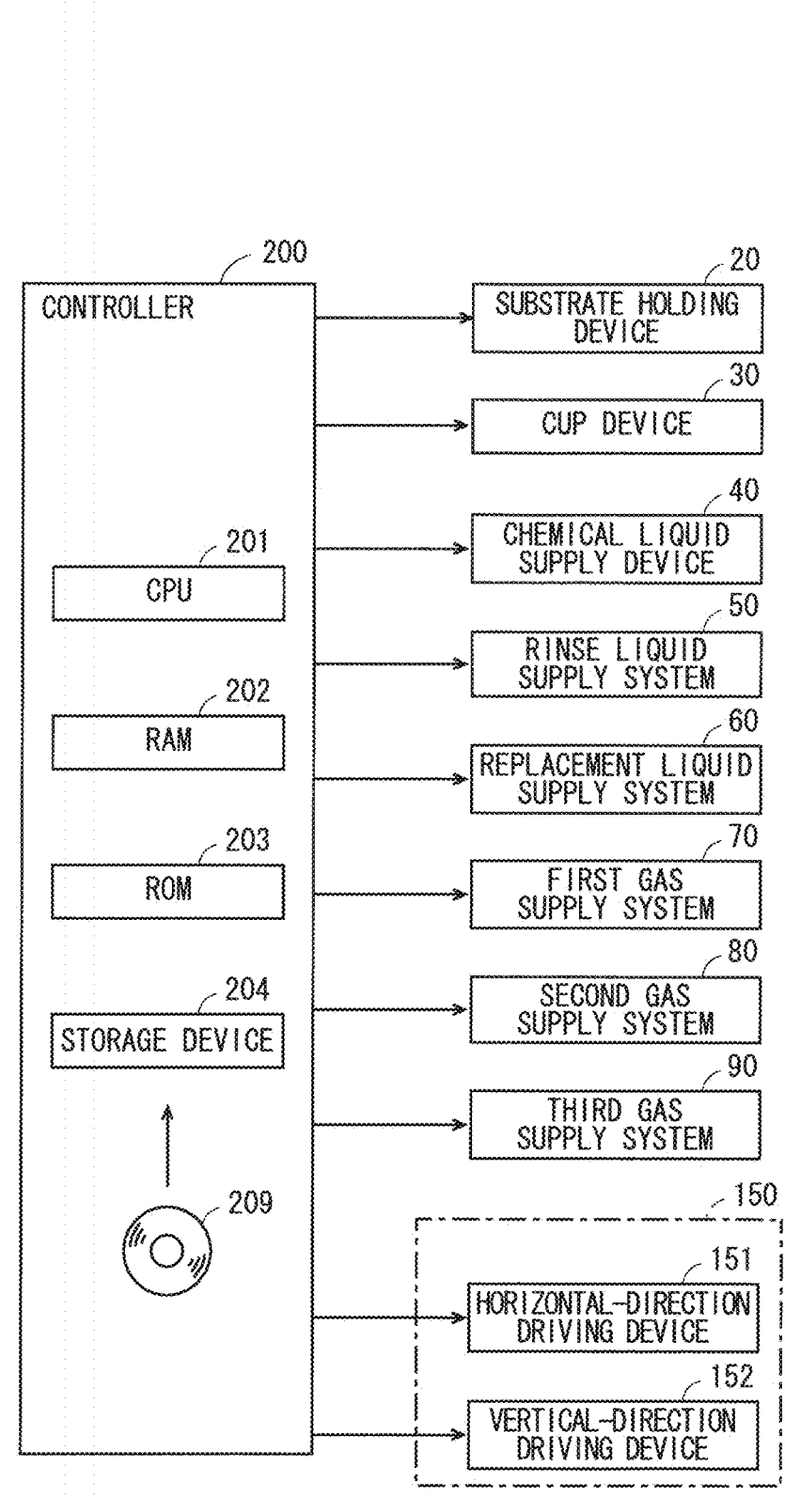
FIG. 6 is a block diagram showing the configuration of a control system of the substrate processing apparatus of FIG. 1.

A control system of the substrate processing apparatus 1 will be described together with the configuration of the controller 200 of FIG. 1. FIG. 6 is a block diagram showing the configuration of the control system of the substrate processing apparatus 1 of FIG. 1. As shown in FIG. 6, the controller 200 includes a CPU (Central Processing Unit) 201, a RAM (Random Access Memory) 202, a ROM (Read Only Memory) 203 and a storage device 204. The RAM 202 is used as a work area for the CPU 201. A system program is stored in the ROM 203. The storage device 204 includes a storage medium such as a hard disc or a semiconductor memory, and stores a substrate cleaning program for performing the above-mentioned series of processes (the chemical liquid process, the rinsing process and the drying process) on the substrate W.

The substrate cleaning program may be provided while being stored in a recording medium such as a CD-ROM 209 and installed in the ROM 203 or the storage device 204. Alternatively, the substrate cleaning program may be distributed from a server outside of the substrate processing apparatus 1 via a communication network and installed in the ROM 203 or the storage device 204.

The CPU 201 executes the substrate cleaning program, thereby controlling the operation of each component of the substrate processing apparatus 1. Specifically, the controller 200 controls the substrate holding device 20. Thus, the controller 200 causes the substrate holding device 20 to hold the substrate W carried into the substrate processing apparatus 1. Further, the controller 200 releases the holding state of the substrate W held by the substrate holding device 20 to carry out the substrate W from the substrate processing apparatus 1. Further, the controller 200 rotates the substrate W held by the substrate holding device 20 at a preset speed.

Further, the controller 200 controls the cup device 30. Thus, the controller 200 moves each of the outer cup 30A and the inner cup 30B of FIG. 1 between the cup upper position and the cup lower position.

Further, the controller 200 controls the chemical liquid supply device 40. Thus, during the chemical liquid process, the controller 200 moves the chemical liquid nozzle 41 in the chamber CH and supplies the chemical liquid to the chemical liquid nozzle 41. Further, the controller 200 controls the rinse liquid supply system 50. Thus, during the rinsing process, the controller 200 supplies the rinse liquid to the rinse liquid nozzle 51.

Further, the controller 200 controls the replacement liquid supply system 60. Thus, when the rinse liquid on the substrate W is replaced with the replacement liquid in the drying process, the controller 200 supplies the replacement liquid to the nozzle device 100.

Further, the controller 200 controls the first gas supply system 70, the second gas supply system 80 and the third gas supply system 90. Thus, when the replacement liquid on the substrate W is removed in the drying process, the controller 200 supplies the first gas to the nozzle device 100. Further, during the drying process, the controller 200 supplies the second gas and the third gas to the nozzle device 100.

Further, the controller 200 controls the horizontal-direction driving device 151 and the vertical-direction driving device 152 of the nozzle movement device 150. Thus, during the drying process, the controller 200 moves the nozzle device 100 in the chamber CH.

4. Operation of Substrate Processing Apparatus 1

Figure 7:
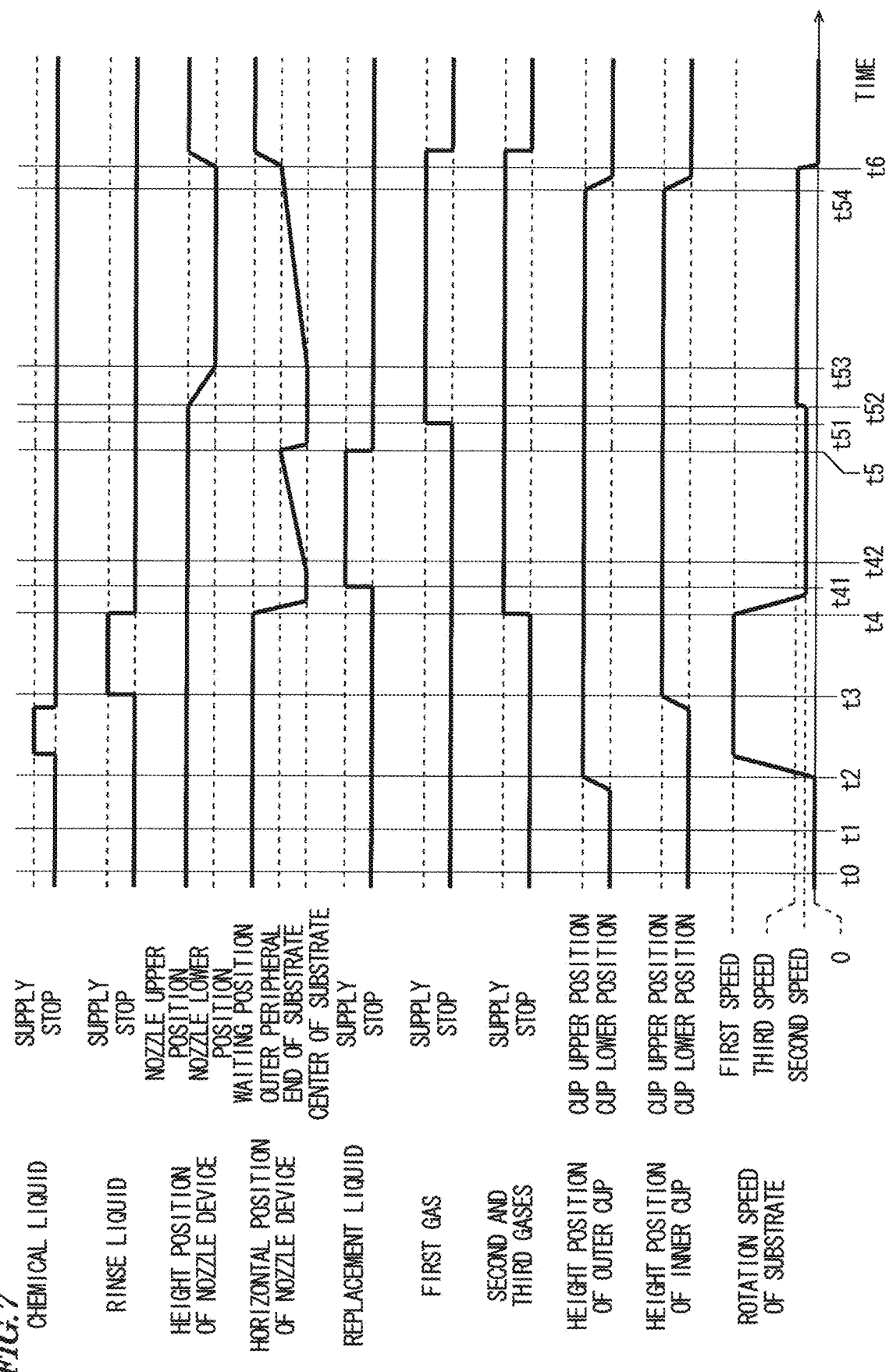
FIG. 7 is a time chart for explaining one example of the operations of respective constituent elements in a case in which a series of processes are executed on a substrate using the substrate processing apparatus of FIG. 1.

An example of a specific operation of the substrate processing apparatus 1 in a case in which the series of processes are executed on the substrate W by execution of the substrate cleaning program by the CPU 201 of FIG. 6 will be described. FIG. 7 is a time chart for explaining one example of the operation of each constituent element in a case in which the series of processes are executed on the substrate using the substrate processing apparatus 1 of FIG. 1. FIGS. 8 to 18 are schematic side views showing the operation of each constituent element of the substrate processing apparatus 1 according to the time chart of FIG. 7. The diameter of the substrate W to be subjected to the process of the present example is 300 mm.

At the left end of FIG. 7, ten items regarding to the operations of the substrate processing apparatus 1 are shown. The ten items are "CHEMICAL LIQUID," "RINSE LIQUID," "HEIGHT POSITION OF NOZZLE," "HORIZONTAL POSITION OF NOZZLE," "REPLACEMENT LIQUID," "FIRST GAS," "SECOND AND THIRD GASES," "HEIGHT POSITION OF OUTER CUP," "HEIGHT POSITION OF INNER CUP" and "ROTATION SPEED OF SUBSTRATE," and are arranged in this order from the top position (first row) to the bottom position (tenth row) in an upward-and-downward direction.

At the right of the above-mentioned ten items, the control contents corresponding to these items are shown in a chronological order using the common time axis. At the right of the item "CHEMICAL LIQUID" in the first row, whether the chemical liquid is supplied from the chemical liquid supply device 40 to the chemical liquid nozzle 41 (supply or stop) is shown. At the right of the item "RINSE LIQUID" in the second row, whether the rinse liquid is supplied from the rinse liquid supply system 50 to the rinse liquid nozzle 51 (supply or stop) is shown.

At the right of the item "HEIGHT POSITION OF NOZZLE DEVICE" in the third row, the positions (the nozzle upper position and the nozzle lower position) in the vertical direction of the nozzle device 100 in the substrate processing apparatus 1 are shown. At the right of the item "HORIZONTAL POSITION OF NOZZLE DEVICE" in the fourth row, the position of the nozzle device 100 in a horizontal plane of the substrate processing apparatus 1 is shown. "WAITING POSITION" indicated as the horizontal position is the waiting position of the nozzle device 100, and is set in advance at a position outward (sideward) of the outer cup 30A. Further, "OUTER PERIPHERAL END OF SUBSTRATE" is the position of the nozzle device 100 when the nozzle device 100 overlaps with the outer peripheral end of the substrate W in plan view, that is, when the nozzle device 100 is above the outer peripheral end of the substrate W. Further, "CENTER OF SUBSTRATE" is the position of the nozzle device 100 when the nozzle device 100 overlaps with the center WC of the substrate W in plan view, that is, when the nozzle device 100 is above the center WC of the substrate W.

At the right of the item "REPLACEMENT LIQUID" in the fifth row, whether the replacement liquid is supplied from the replacement liquid supply system 60 to the nozzle device 100 (supply or stop) is shown. At the right of the item "FIRST GAS" in the sixth row, whether the first gas is supplied from the first gas supply system 70 to the nozzle device 100 (supply or stop) is shown. At the right of the item "SECOND AND THIRD GASES" in the seventh row, whether the second gas and the third gas are supplied from the second gas supply system 80 and the third gas supply system 90 to the nozzle device 100 (supply or stop) is shown.

At the right of the item "HEIGHT POSITION OF OUTER CUP" in the eighth row, the position in the vertical direction of the outer cup 30A in the substrate processing apparatus 1 is shown. At the right of the item "HEIGHT POSITION OF INNER CUP" in the ninth row, the position in the vertical direction of the inner cup 30B in the substrate processing apparatus 1 is shown. At the right of the item "ROTATION SPEED OF SUBSTRATE" in the tenth row, a change in rotation speed of the rotating substrate W held by the substrate holding device 20 is shown.

First, in an initial state (a point t0 in time), the supply of "CHEMICAL LIQUID" to the chemical liquid nozzle 41 is stopped. Further, the supply of "RINSE LIQUID" to the rinse liquid nozzle 51 is stopped. Further, the supply of "REPLACEMENT LIQUID," "FIRST GAS" and "SECOND AND THIRD GASES" to the nozzle device 100 is stopped. Further, "HEIGHT POSITION OF NOZZLE" is maintained at the nozzle upper position, "HORIZONTAL POSITION OF NOZZLE" is maintained at the waiting position, and "HEIGHT POSITION OF OUTER CUP" and "HEIGHT POSITION OF INNER CUP" are maintained at the cup lower position. Further, in the initial state, because the substrate W is not held by the substrate holding device 20, "ROTATION SPEED OF SUBSTRATE" is 0 rpm.

At a point t1 in time, the substrate W is carried into the chamber CH of the substrate processing apparatus 1, and the substrate W is placed on the substrate holder 21. Further, the substrate W is held by the substrate holder 21. Next, the chemical liquid process for the substrate W is executed from a point t2 to a point t3 in time. Specifically, the rotation of the substrate W held by the substrate holder 21 is started from the point t2 in time. Further, the rotation speed is increased from the 0 rpm to a first speed, which is relatively high, and is maintained at the first speed. In the present embodiment, the first speed is 1500 rpm.

Figure 8:
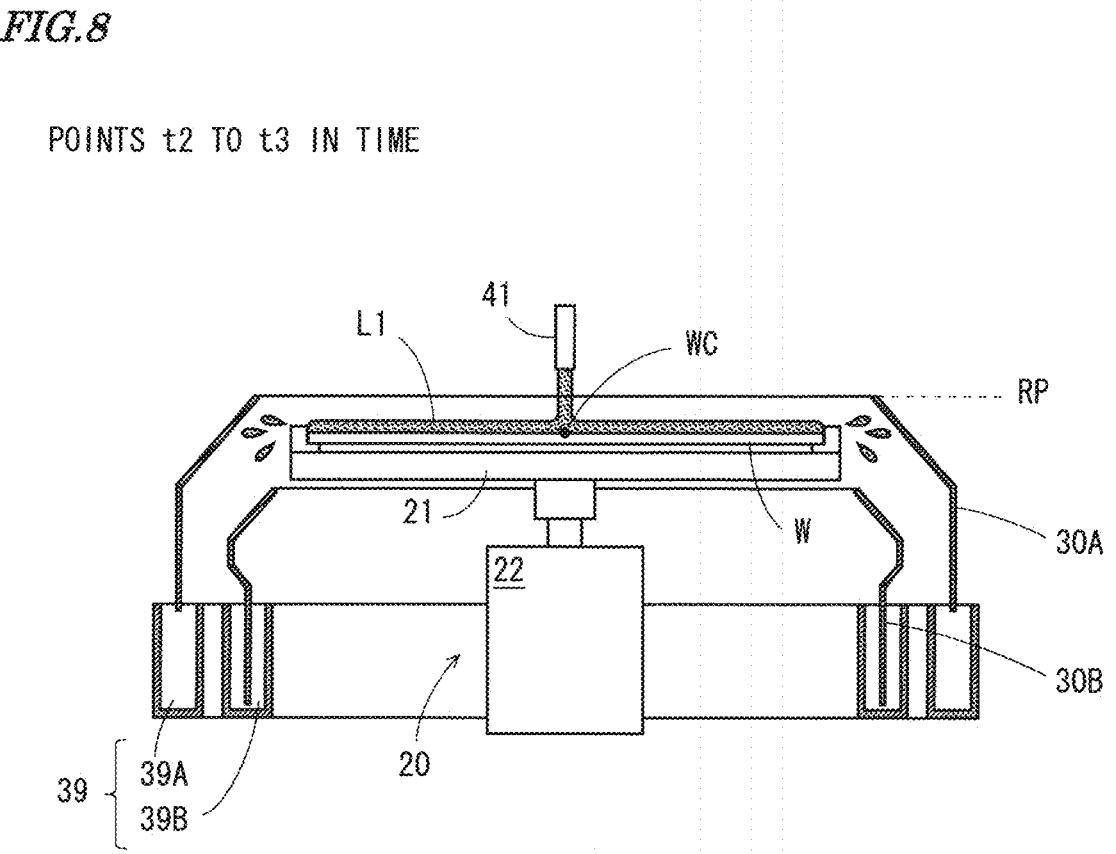
FIG. 8 is a schematic side view showing the operation of each constituent element of the substrate processing apparatus according to the time chart of FIG. 7.

With the rotation speed of the substrate W maintained at the first speed, the chemical liquid nozzle 41 is arranged at the processing position above the substrate W as shown in FIG. 8. Further, in a predetermined constant period, a chemical liquid L1 is discharged from the chemical liquid nozzle 41 toward the center WC of the substrate W. Thus, the liquid film of the chemical liquid L1 spreads over the entire upper surface of the substrate W.

As described above, the chemical liquid process proceeds. During the chemical liquid process, the chemical liquid L1 is splashed from the rotating substrate W. In order to receive the splashed chemical liquid L1, the outer cup 30A is set at the cup upper position immediately before the point t2 in time. Thus, the chemical liquid L1 received by the outer cup 30A is discarded through the outer container 39A. In FIG. 8, the height position of the upper end portion of the outer cup 30A located at the cup upper position is indicated by a reference character RP.

Figure 9:
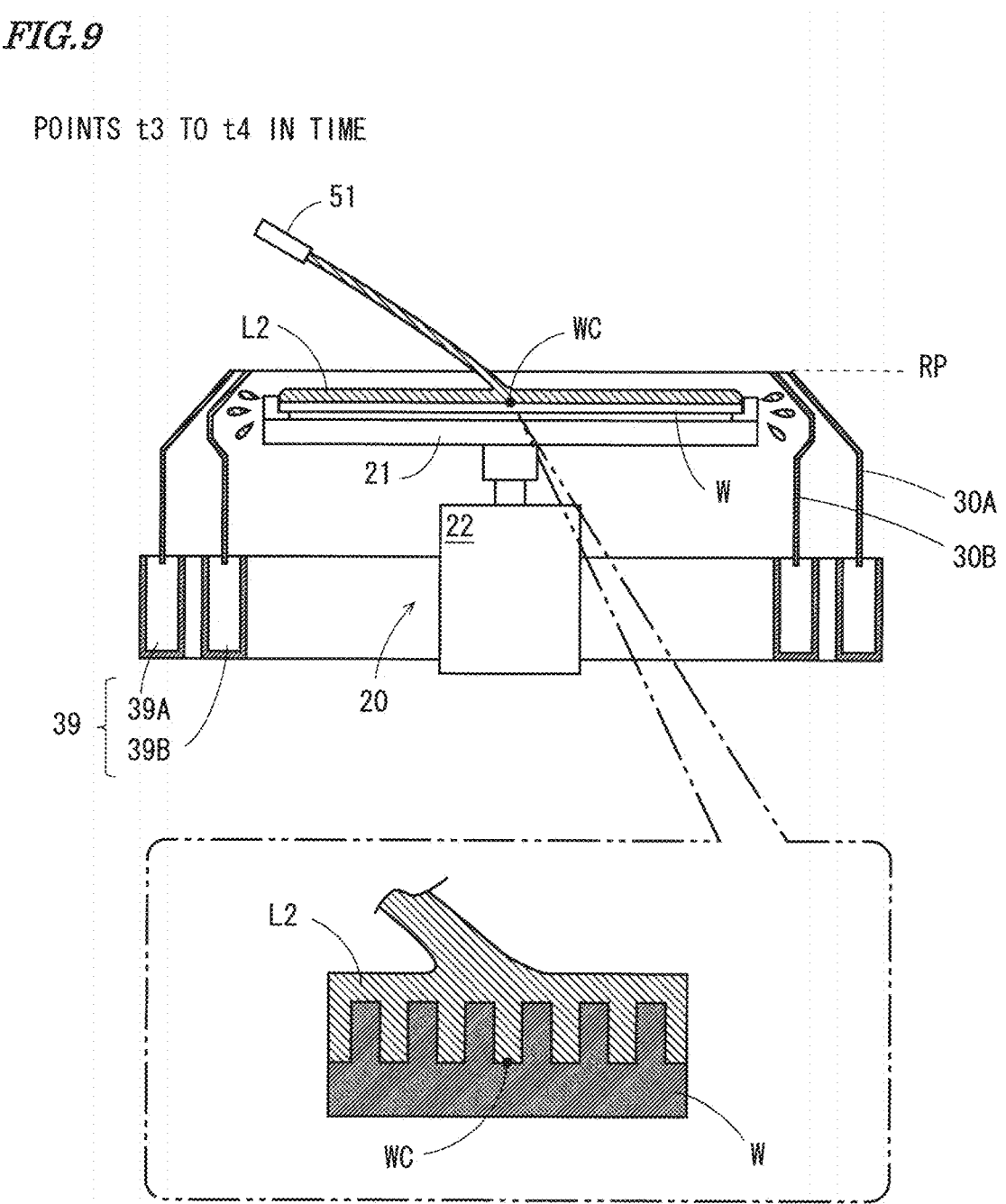
FIG. 9 is a schematic side view showing the operation of each constituent element of the substrate processing apparatus according to the time chart of FIG. 7.

Next, after the discharge of the chemical liquid L1 from the chemical liquid nozzle 41 to the substrate W is stopped, the rinsing process for the substrate W is executed from the point t3 to a point t4 in time. In the rinsing process, the rotation speed of the substrate W is maintained at the first speed. Further, as shown in FIG. 9, a rinse liquid L2 is discharged from the rinse liquid nozzle 51 toward the center WC of the substrate W. Thus, the liquid film of the rinse liquid L2 spreads over the entire upper surface of the substrate W, and the chemical liquid L1 remaining on the substrate W is replaced with the rinse liquid L2.

In FIG. 9, in the balloon of the two-dot and dash line, a partially enlarged cross-sectional view of the substrate W during the rinsing process is shown. With reference to the cross-sectional view, in the upper surface of the substrate W, multiple grooves having a depth in the direction orthogonal to the substrate W (the vertical direction in the present example) are formed to have a predetermined pattern. Each groove is filled with the rinse liquid L2.

As described above, the rinsing process proceeds. During the rinsing process, the rinse liquid L2 is mainly splashed from the rotating substrate W. In order to receive the splashed rinse liquid L2, the inner cup 30B is set at the cup upper position immediately before the point t3 in time. Thus, the rinse liquid L2 received by the inner cup 30B is discarded through the inner container 39B. In part of FIG. 9 and the subsequent diagrams, the height position of the upper end portion of the inner cup 30B located at the cup upper position is indicated by the reference character RP.

Next, after the rinsing process ends, the drying process for the substrate is executed from the point t4 to a point t6 in time. In the drying process, as a pre-process, a process of replacing the rinse liquid L2 remaining on the substrate W with the replacement liquid L3 is first executed from the point t4 to a point t5 in time. A point t41 and a point t42 in time, described below, indicate specific points in time between the point t4 and the point t5 in time.

Figure 10:
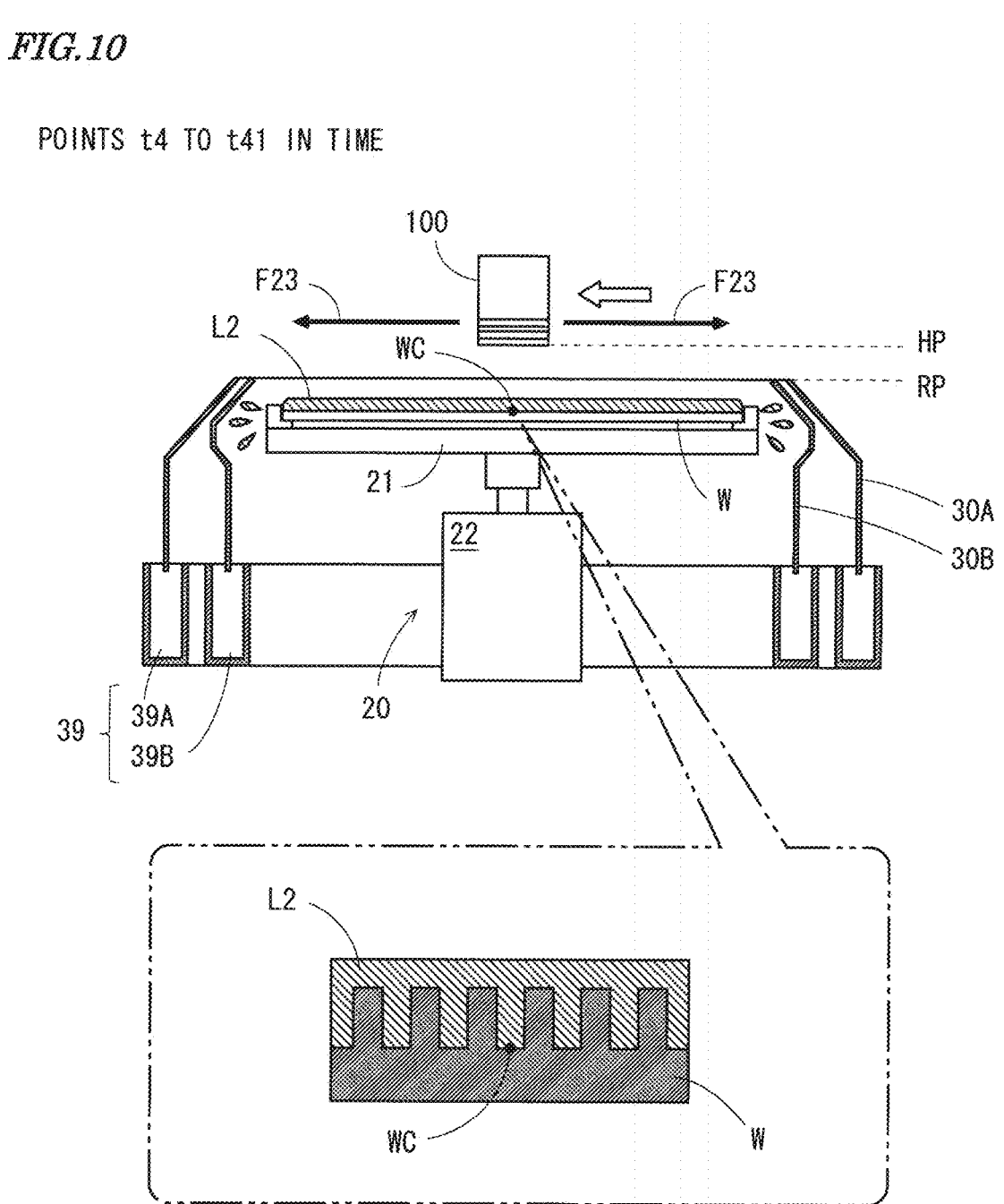
FIG. 10 is a schematic side view showing the operation of each constituent element of the substrate processing apparatus according to the time chart of FIG. 7.

Specifically, as it passes the point t4 in time, with the height position of the nozzle device 100 maintained at a nozzle upper position HP, the nozzle device 100 is moved in the horizontal direction from the waiting position to the center of the substrate. The nozzle upper position HP is the height position higher than the cup upper position of the outer cup 30A and the inner cup 30B. Thus, as shown in FIG. 10, the lower end portion of the nozzle device 100 (the replacement liquid discharge port 62 and the first gas injection port 72 of FIG. 5) is opposite to the center WC of the substrate W.

When it passes the point t4 in time, the second gas and the third gas are further supplied to the nozzle device 100 from the second gas supply system 80 and the third gas supply system 90. Thus, as indicated by the thick solid arrows in FIG. 10, a flow F23 of the second gas and the third gas is formed in the horizontal direction from the vicinity of the lower end portion of the nozzle device 100 (the second gas injection port 131 and the third gas injection port 132 of FIG. 5, specifically). In the present embodiment, the flow rate of the second gas supplied to the nozzle device 100 is 72.5 L/min, and the flow rate of the third gas supplied to the nozzle device 100 is also 72.5 L/min.

Further, when it passes the point t4 in time, the substrate holding device 20 is controlled, so that the rotation speed of the substrate W is reduced from the first speed to a second speed lower than the first speed and is maintained at the second speed. In the present embodiment, the second speed is 100 rpm.

Figure 11:
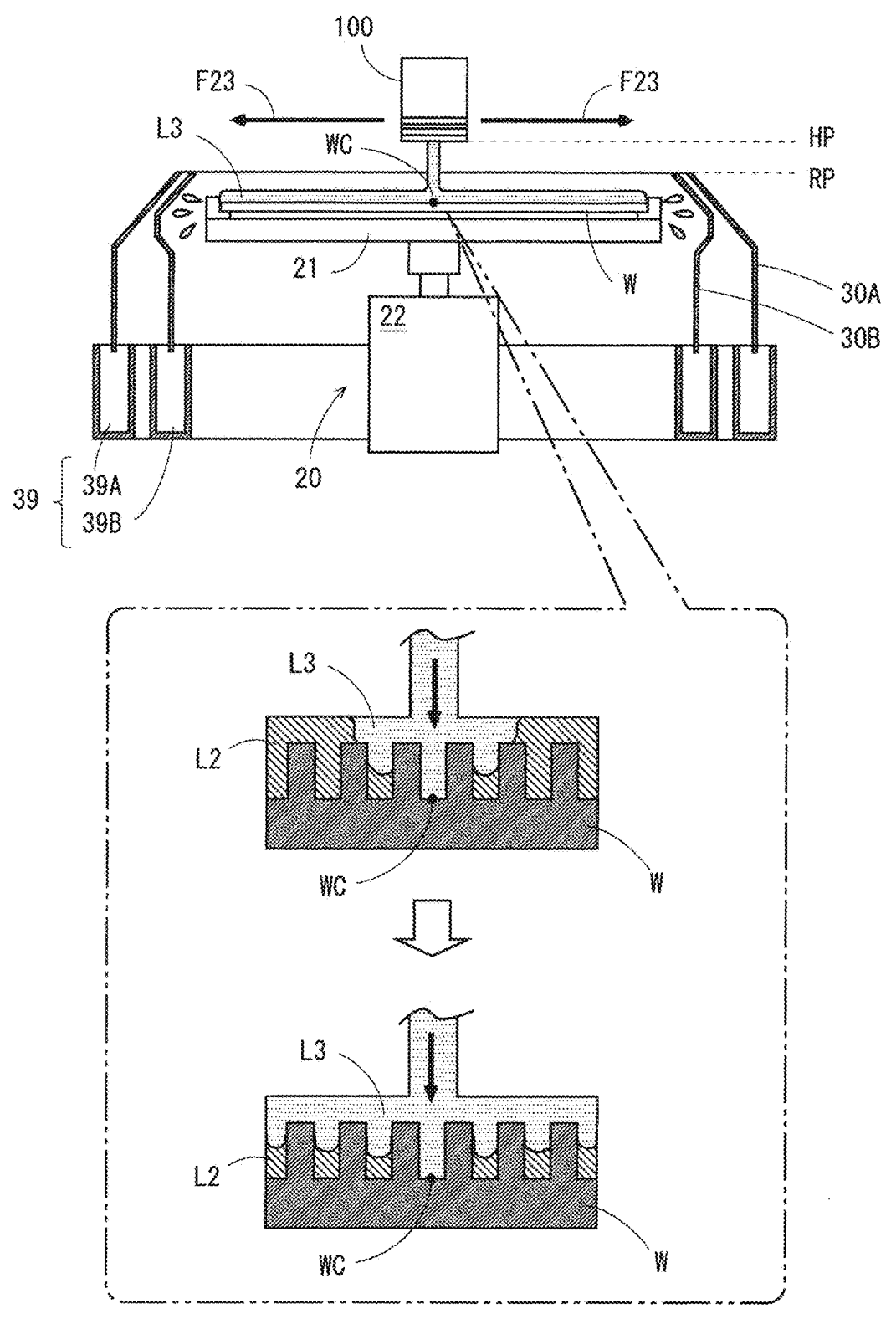
FIG. 11 is a schematic side view showing the operation of each constituent element of the substrate processing apparatus according to the time chart of FIG. 7.

At the point t41 in time that is later than the point t4 in time by a minute period, the replacement liquid L3 is supplied from the replacement liquid supply system 60 to the nozzle device 100. In the present embodiment, the flow rate of the replacement liquid L3 supplied to the nozzle device 100 is not less than 0.1 L/min and not more than 0.5 L/min. In this case, as shown in FIG. 11, the replacement liquid L3 is discharged from the lower end portion (the replacement liquid discharge port 62 of FIG. 5) of the nozzle device 100 toward the center WC of the substrate W. Thus, the liquid film of the replacement liquid L3 spreads over the entire upper surface of the substrate W. At this time, as shown in the upper portion in the balloon of the two-dot and dash line in FIG. 11, the replacement liquid L3 discharged in the direction orthogonal to the substrate W is smoothly guided into the plurality of grooves formed on the substrate W. Further, because being discharged from the nozzle device 100 located at the nozzle upper position HP, the replacement liquid L3 collides with the obverse surface of the substrate W with energy higher than the energy generated in a case in which the replacement liquid L3 is discharged from the nozzle device 100 located at the nozzle lower position. Thus, the rinse liquid L2 remaining in the grooves located at the center WC of the substrate W is more efficiently replaced with the replacement liquid L3.

However, in the area except for the center WC of the substrate W, since flowing in the horizontal direction toward the peripheral portion of the substrate W, the replacement liquid L3 is unlikely to enter each groove. Therefore, as shown in the lower portion in the balloon of the two-dot and dash line in FIG. 11, large part of the grooves is likely to have the rinse liquid L2. As such, in the present example, from the point t42 that is further later than the point t41 in time by a minute period to the point t5 in time, with the height position of the nozzle device 100 maintained at the nozzle upper position HP, the nozzle device 100 is moved in the horizontal direction from the center to the outer peripheral end of the substrate.

Figure 12:
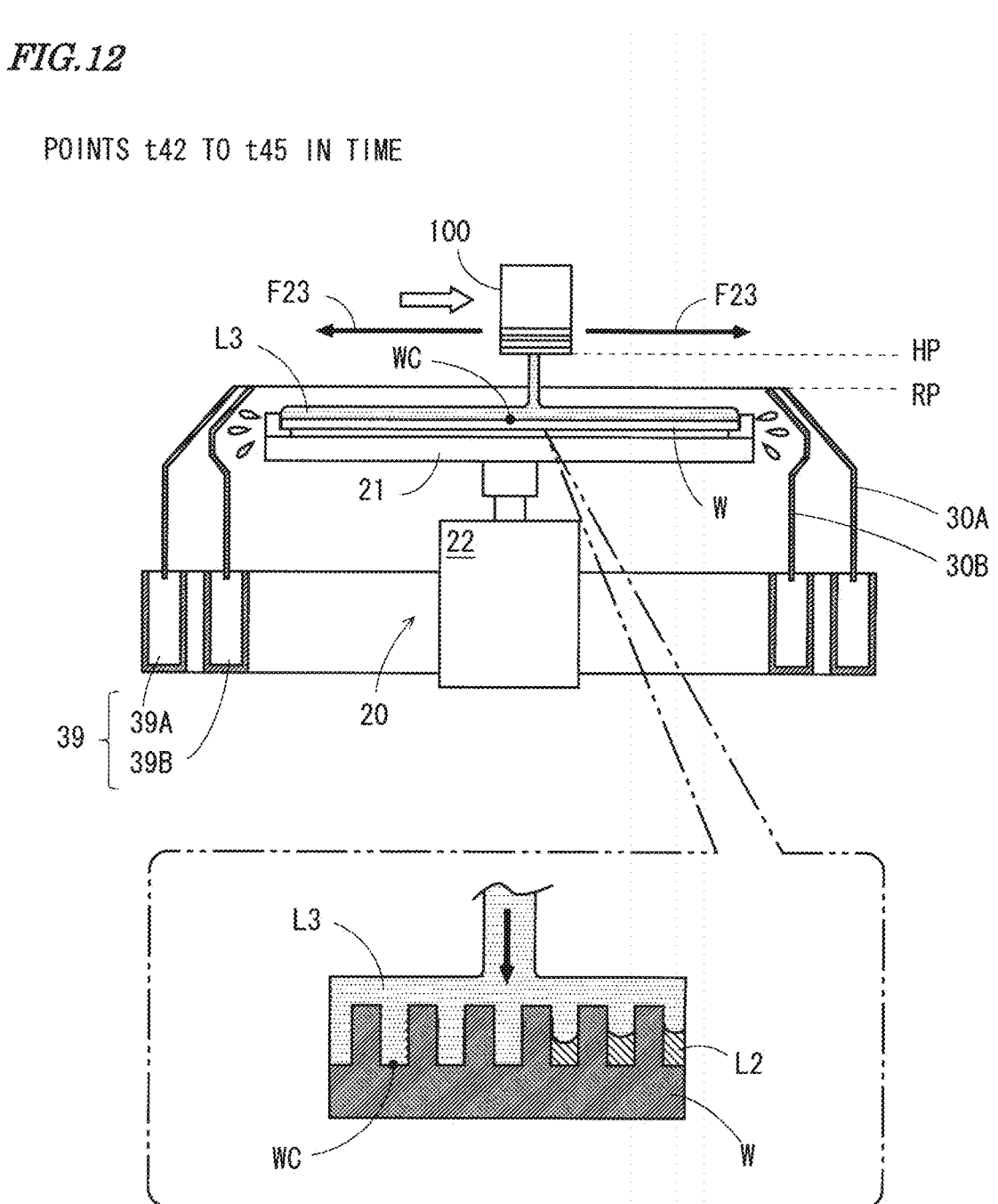
FIG. 12 is a schematic side view showing the operation of each constituent element of the substrate processing apparatus according to the time chart of FIG. 7.
Figure 13:
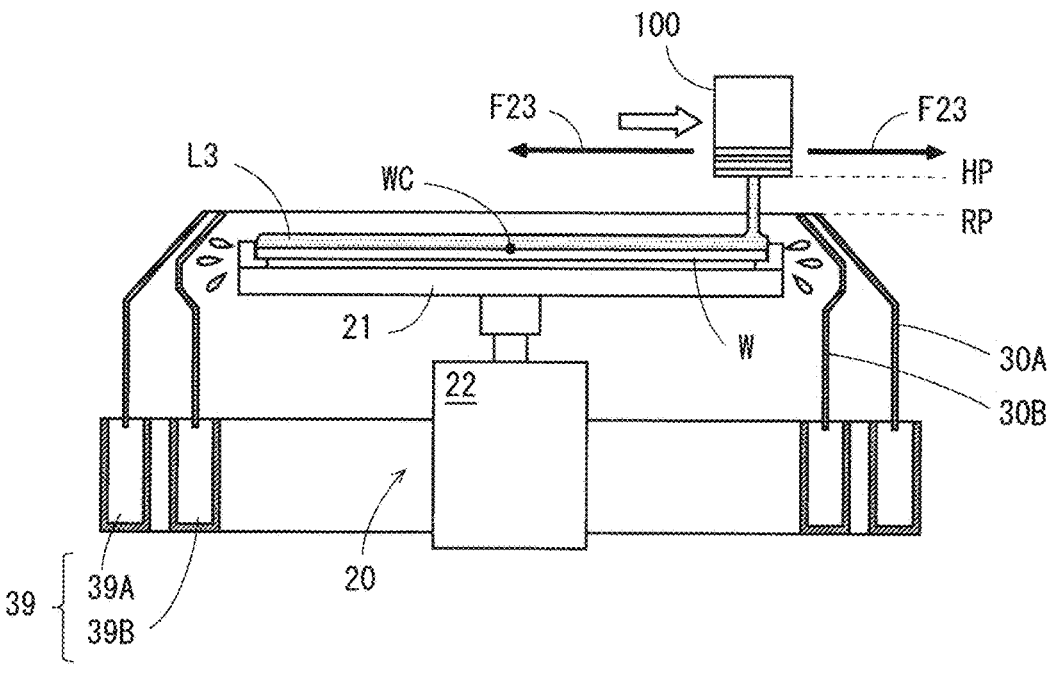
FIG. 13 is a schematic side view showing the operation of each constituent element of the substrate processing apparatus according to the time chart of FIG. 7.

In this case, as shown in FIG. 12, as the nozzle device 100 is moved, the rinse liquid L2 in the grooves located immediately below the nozzle device 100 is forcibly replaced with the replacement liquid L3. Thereafter, as shown in FIG. 13, the nozzle device 100 reaches the outer peripheral end of the substrate at the point t5 in time, so that all of the grooves on the substrate W are filled with the replacement liquid L3, and the rinse liquid is removed. The period of time from the point t42 to the point t5 in time is 5 sec, for example.

As described above, in the step of replacing the rinse liquid L2 on the substrate W with the replacement liquid L3, the nozzle device 100 is maintained at the nozzle upper position HP. Further, as described above, the nozzle upper position HP is higher than the cup upper position of the outer cup 30A and the inner cup 30B. Thus, when the replacement liquid L3 is discharged to the outer peripheral end and its vicinity of the substrate W, the nozzle device 100 does not interfere with the outer cup 30A or the inner cup 30B.

Subsequently, as a post-process for the drying process, a process of removing the replacement liquid L3 remaining on the substrate W is executed from the point t5 to a point t6 in time. A point 51 in time, a point t52 in time, a point t53 in time and a point t54 in time, described below, indicates specific points in time between the points t5 and t6 in time.

Figure 14:
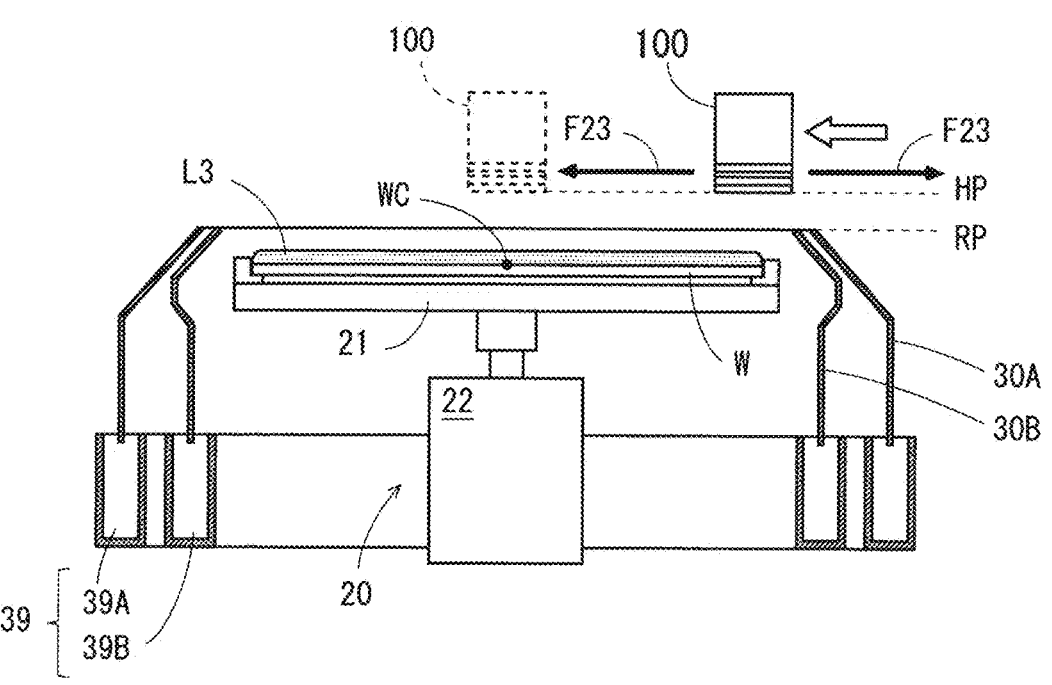
FIG. 14 is a schematic side view showing the operation of each constituent element of the substrate processing apparatus according to the time chart of FIG. 7.

Specifically, as it passes the point t5 in time, the supply of the replacement liquid L3 from the replacement liquid supply system 60 to the nozzle device 100 is stopped. Thereafter, as shown in FIG. 14, with the height position of the nozzle device 100 maintained at the nozzle upper position HP, the nozzle device 100 is moved in the horizontal direction from the outer peripheral end to the center of the substrate.

Figure 15:
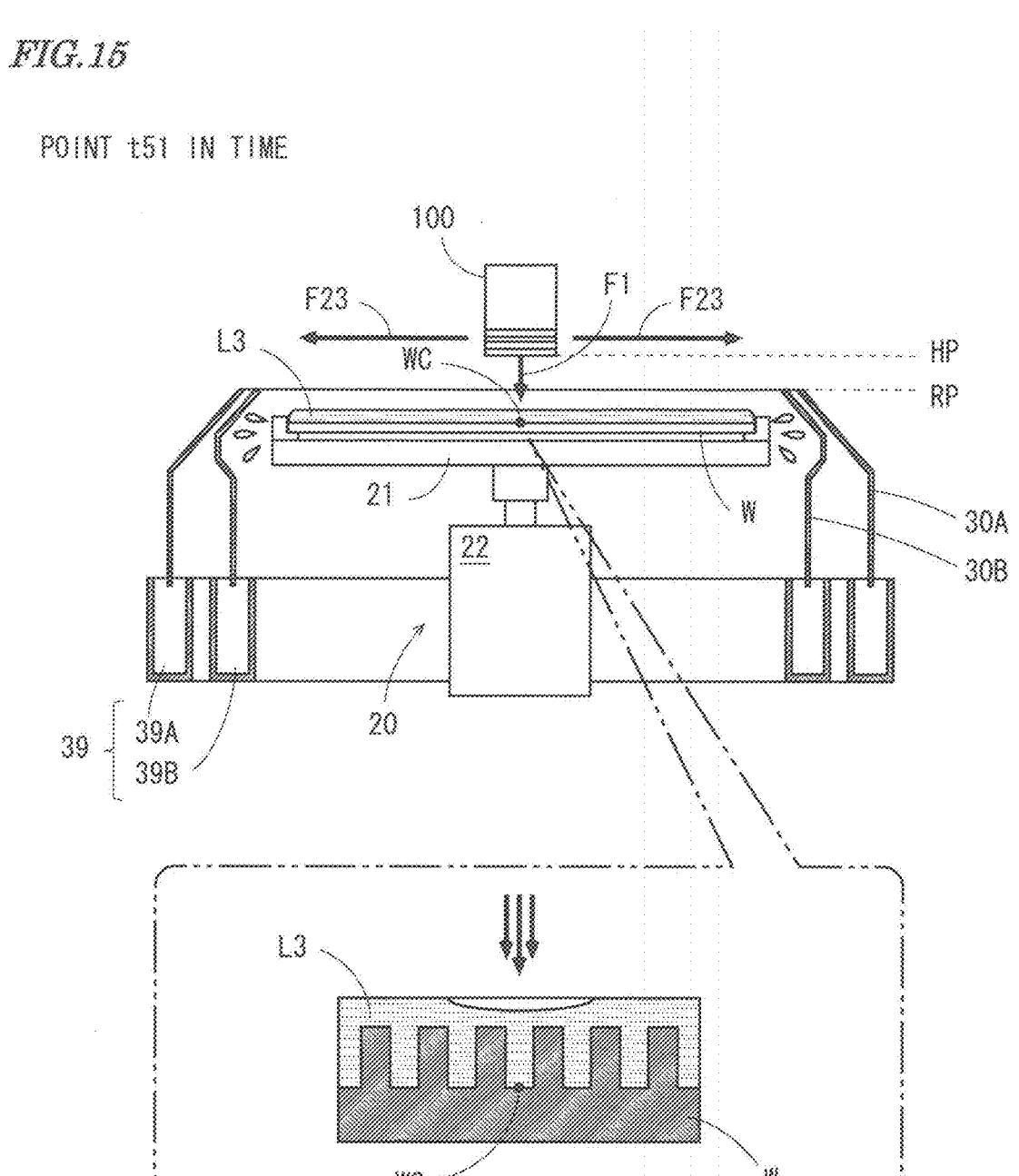
FIG. 15 is a schematic side view showing the operation of each constituent element of the substrate processing apparatus according to the time chart of FIG. 7.

Next, at the point t51 in time that is later than the point t5 in time by a minute period, with the nozzle device 100 located above the center WC of the substrate, the first gas is supplied from the first gas supply system 70 to the nozzle device 100. In the present embodiment, the flow rate of the first gas supplied to the nozzle device 100 is 5 L/min, 25 L/min or 50 L/min. In this case, as shown in FIG. 15, the first gas is injected from the lower end portion (the first gas injection port 72 of FIG. 5) of the nozzle device 100 to the center WC of the substrate W. In each of FIGS. 15 to 18, a flow F1 of the first gas is indicated by the thick solid arrow.

At this time, the nozzle device 100 is located at the nozzle upper position HP. Therefore, a relatively large distance is ensured between the nozzle device 100 and the substrate W. Therefore, a degree of impact generated when the first gas injected from the nozzle device 100 collides with the substrate W is sufficiently lower than the impact generated in a case in which the first gas is injected with the nozzle device 100 located at the nozzle lower position. Therefore, as shown in the balloon of the two-dot and dash line in FIG. 15, at the point t51 in time, the replacement liquid L3 on the substrate W is hardly affected by the first gas.

Next, at the point t52 in time, the rotation speed of the substrate W is increased from the second speed to a third speed that is higher than the second speed and lower than the first speed, and is maintained at the third speed. In the present embodiment, the third speed is 300 rpm.

Figure 16:
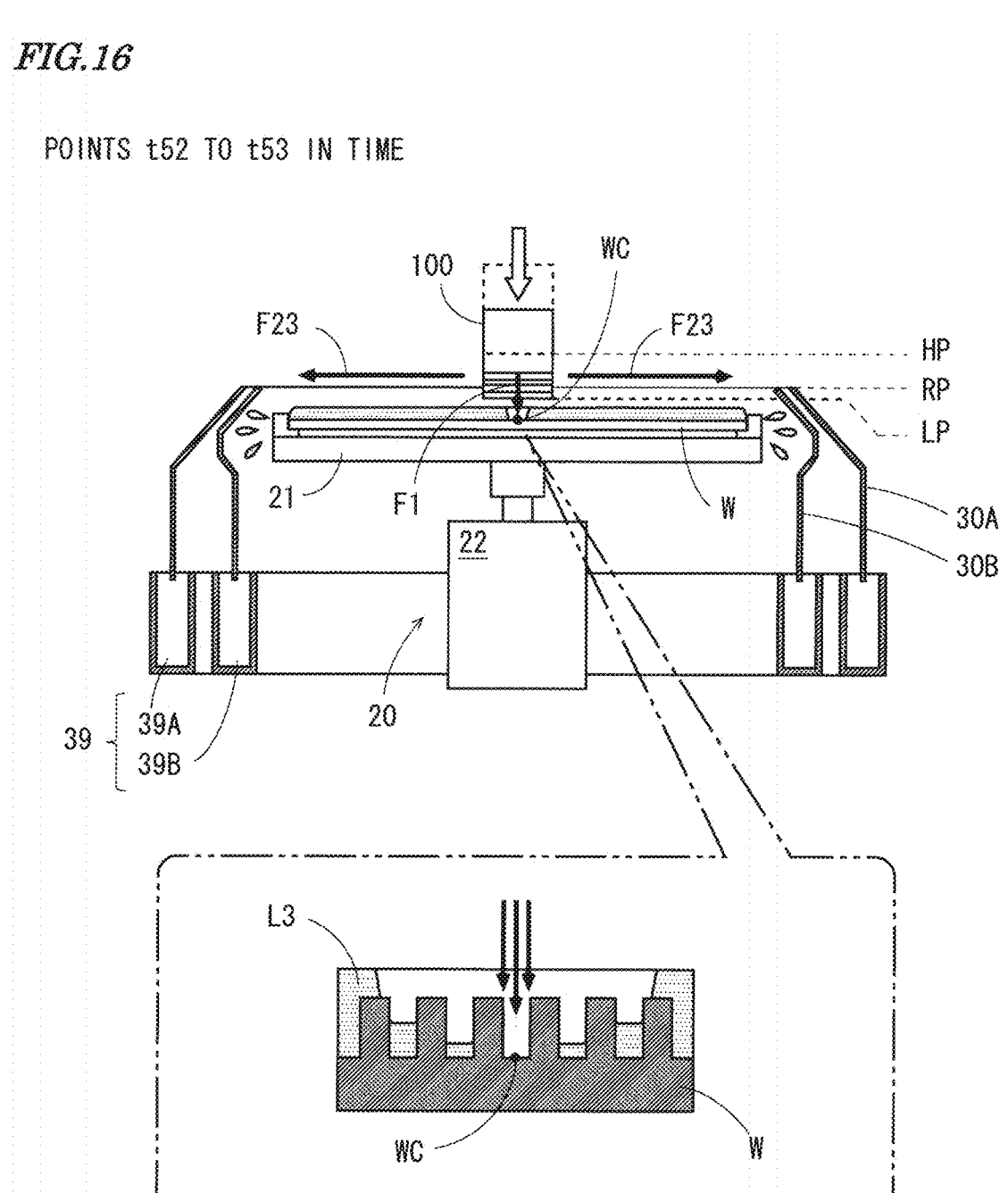
FIG. 16 is a schematic side view showing the operation of each constituent element of the substrate processing apparatus according to the time chart of FIG. 7.

Further, from the point t52 to the point t53 in time, as shown in FIG. 16, the height position of the nozzle device 100 is lowered from the nozzle upper position HP to the nozzle lower position LP. The nozzle lower position LP is the height position lower than the nozzle upper position HP and higher than the substrate W. Thus, a degree of impact generated when the first gas injected from the nozzle device 100 collides with the substrate W gradually increases.

At this time, as shown in the balloon of the two-dot and dash line in FIG. 16, the first gas injected in the direction orthogonal to the substrate W is smoothly guided into the plurality of grooves formed on the substrate W. Thus, the replacement liquid L3 remaining in the grooves located at the center WC of the substrate W is completely removed by the first gas at the point t53 in time.

Figure 17:
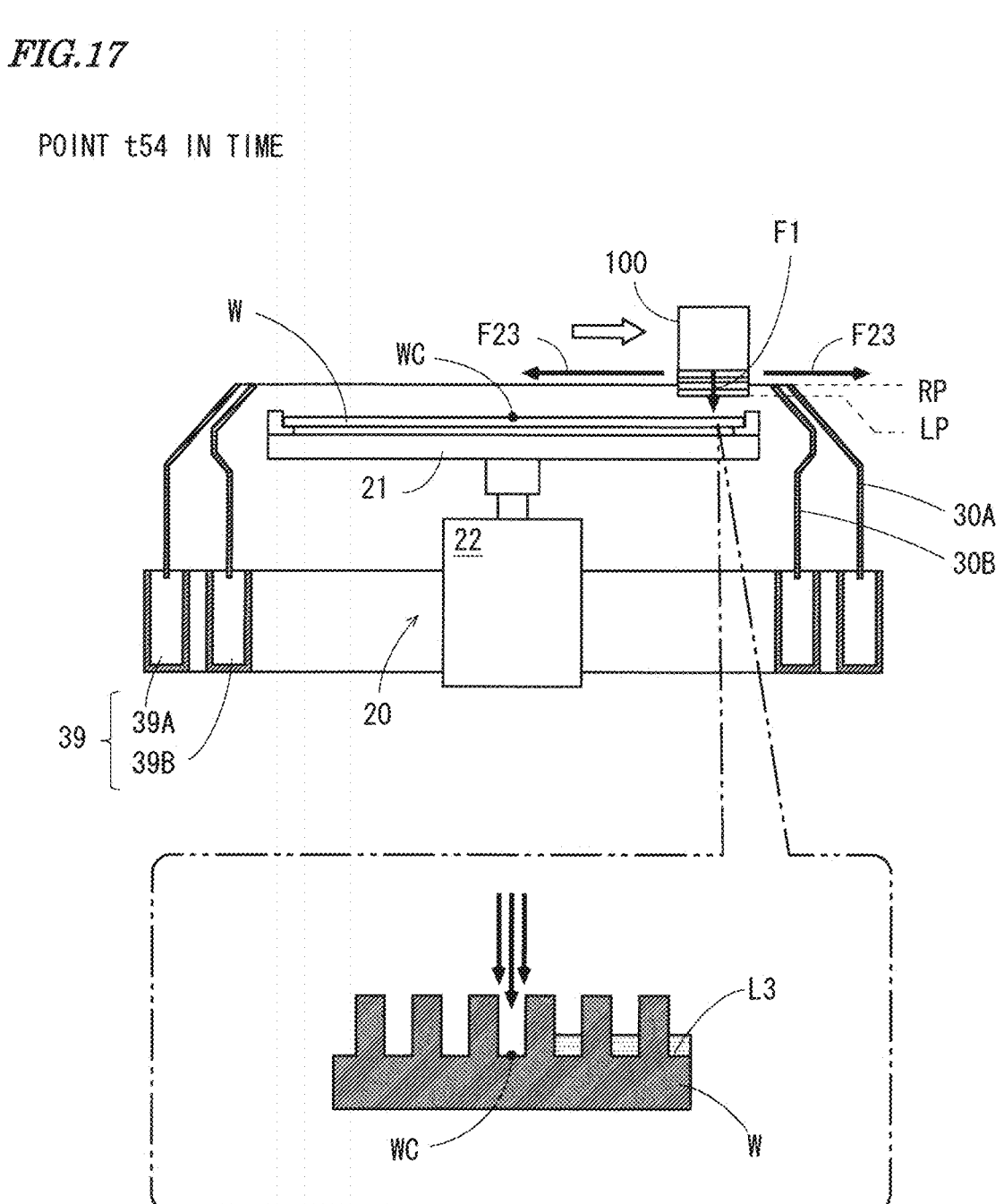
FIG. 17 is a schematic side view showing the operation of each constituent element of the substrate processing apparatus according to the time chart of FIG. 7.
Figure 18:
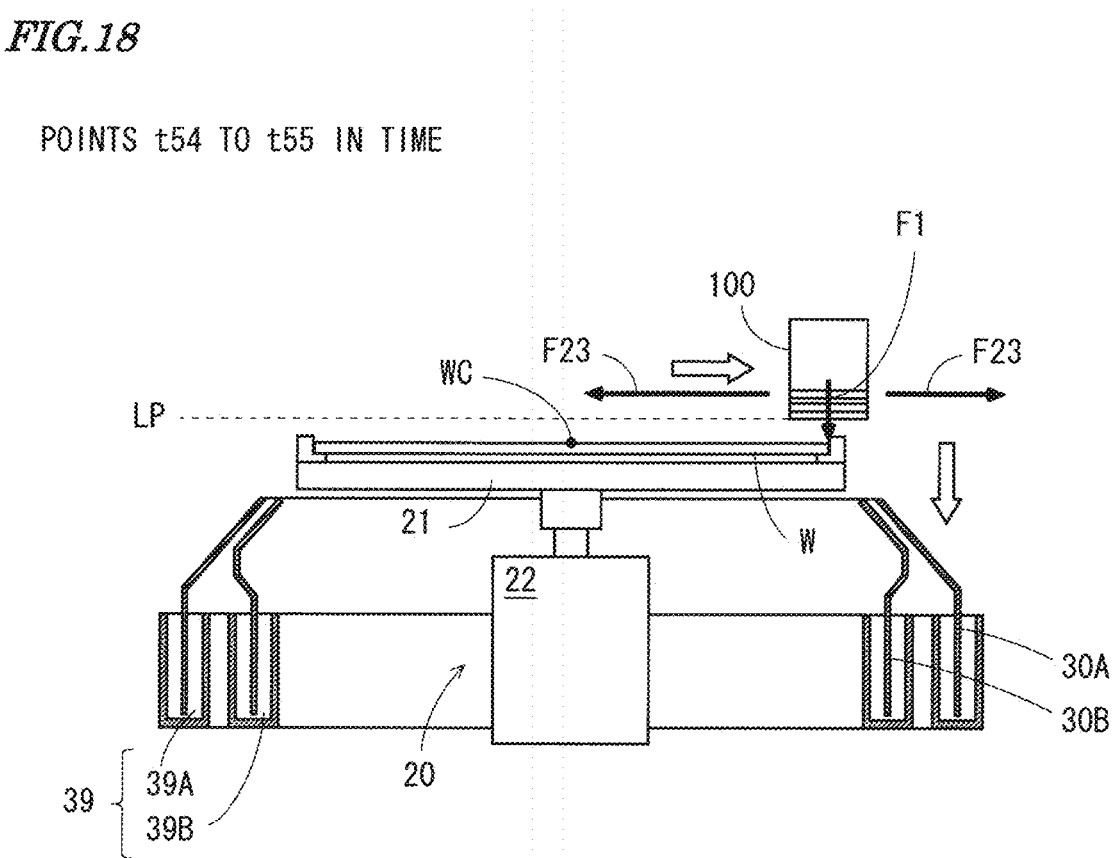
FIG. 18 is a schematic side view showing the operation of each constituent element of the substrate processing apparatus according to the time chart of FIG. 7.

However, in the area except for the center WC of the substrate W, since the first gas is not blown to the bottom portion of each groove, it is difficult to completely remove the replacement liquid L3 remaining in the groove. As such, in the present example, from the point t53 to the point t6 in time, with the height position of the nozzle device 100 maintained at the nozzle lower position LP, the nozzle device 100 is moved in the horizontal direction from the center to the outer peripheral end of the substrate. In this case, as shown in FIG. 17, as the nozzle device 100 is moved, the replacement liquid L3 in the grooves located immediately below the nozzle device 100 is forcibly blown off and removed by the first gas. Thereafter, as shown in FIG. 18, the nozzle device 100 reaches the outer peripheral end of the substrate at the point t6 in time, so that the replacement liquid L3 in all of the grooves on the substrate W is completely removed, and the substrate W is dried. The period of time from the point t53 to the point t6 in time is 10 sec, for example.

Meanwhile, with the outer cup 30A and the inner cup 30B located at the cup upper position, when the nozzle device 100 located at the nozzle lower position LP moves toward the outer peripheral end of the substrate W, the nozzle device 100 is highly likely to interfere with the outer cup 30A and the inner cup 30B. As such, in the present example, at the point t54 in time immediately before the point t6 in time at which the nozzle device 100 reaches the outer peripheral end of the substrate, the height position of the outer cup 30A and the inner cup 30B is changed from the cup upper position to the cup lower position.

As described above, the drying process ends at the point t6 in time. After the drying process ends, the supply of the first gas, the second gas and the third gas to the nozzle device 100 is stopped. Further, the height position of the nozzle device 100 is regulated to the nozzle upper position HP, and the nozzle device 100 is returned to the waiting position. Further, the rotation of the substrate W is stopped. In this state, the substrate W is carried out from the chamber CH of the substrate processing apparatus 1.

5. Effects of Embodiments (a) In the above-mentioned substrate processing apparatus 1, in the pre-process for the drying process, an operation of replacing the rinse liquid remaining on the substrate W by the rinsing process with the replacement liquid is performed. Specifically, the nozzle device 100 is arranged at the nozzle upper position HP, and the replacement liquid discharge port 62 is opposite to the center WC of the substrate W. In this state, the replacement liquid is discharged downwardly from the replacement liquid discharge port 62 of the nozzle device 100. Further, the nozzle device 100 is moved in the horizontal direction from the center of the substrate to the outer peripheral end of the substrate. In this case, the nozzle device 100 is held at a height position spaced apart from the substrate W as compared with a case in which the nozzle device 100 is located at the nozzle lower position LP. In particular, the nozzle upper position HP is higher than the upper end portions of the outer cup 30A and the inner cup 30B that are located at the cup upper positions. Therefore, when the nozzle device 100 is moved toward the outer peripheral end of the substrate, the nozzle device 100 do not interfere with the outer cup 30A or the inner cup 30B.

Further, when the nozzle device 100 is moved in the horizontal direction from the center of the substrate to the outer peripheral end of the substrate, the replacement liquid is discharged in the direction orthogonal to the substrate W over the wide range of the upper surface of the substrate W. At this time, the replacement liquid is discharged from the nozzle upper position HP, so that the replacement liquid collides with the obverse surface of the substrate W with the energy larger than that in a case in which the replacement liquid is discharged from the nozzle lower position LP. Therefore, the rinse liquid remaining in the groove on the substrate W is efficiently replaced with the replacement liquid, and the rinse liquid remaining in the groove is smoothly removed.

Subsequently, in a post-process for the drying process, an operation of drying the substrate W by replacing the replacement liquid remaining on the substrate W with the first gas is performed. Specifically, the nozzle device 100 is arranged at the nozzle upper position HP, and the first gas injection port 72 is opposite to the center WC of the substrate W. In this state, the first gas is injected downwardly from the first gas injection port 72 of the nozzle device 100. The nozzle device 100 is lowered from the nozzle upper position HP to the nozzle lower position LP while the first gas is maintained being injected. At this time, a degree of impact generated when the first gas injected from the first gas injection port 72 collides with the substrate W gradually increases as the nozzle device 100 is moved from the nozzle upper position HP to the nozzle lower position LP. Therefore, the change in impact applied to the replacement liquid on the substrate W is alleviated, as compared with a case in which the injection of the first gas is started with the nozzle device 100 located at the nozzle lower position LP. Therefore, the splashing of the replacement liquid caused by the collision of the first gas with the substrate W is reduced. This suppresses a decrease in cleanliness of the substrate W due to re-adherence of the replacement liquid splashed from the substrate W to the substrate W.

Thereafter, with the nozzle device 100 being located at the nozzle lower position LP and with the injection of the first gas continued, the nozzle device 100 is moved in the horizontal direction from the center of the substrate to the outer peripheral end of the substrate. In this case, the first gas is blown in the direction orthogonal to the substrate over the wide range of the upper surface of the substrate W. Thus, the replacement liquid remaining in the large number of grooves on the substrate W is efficiently replaced with the first gas. Therefore, the replacement liquid remaining in the grooves is smoothly removed, and the substrate W is dried. During drying, because the replacement liquid has a lower surface tension than that of the rinse liquid, the pattern formed on the substrate W is less likely to be damaged (collapse of a pattern, etc.) due to the surface tension of the replacement liquid. As a result, it is possible to appropriately remove the rinse liquid remaining on the substrate W after the pattern formation from the substrate W.

(b) When the nozzle device 100 is located in the space above the substrate W, the second gas is injected from the second gas injection port 131. In this case, at a position above the substrate, a flow of the second gas is formed so as to spread in a planar shape in the direction parallel to the upper surface of the substrate W. This suppresses fall of splashing particles at a position higher than the second gas injection port 131 onto the substrate W. This suppresses a decrease in cleanliness of the substrate W after drying.

(c) When the nozzle device 100 is located in the space above the substrate, the third gas is injected from the third gas injection port 132 while the second gas is injected from the second gas injection port 131. A flow of the third gas injected from the third gas injection port 132 blocks a flow of gas between the space above the third gas injection port 132 and the space below the third gas injection port 132. Thus, contaminants such as particles are further prevented from falling on the substrate W from the space above the third gas injector.

Further, with the nozzle device 100 having one attitude, the third gas injection port 132 is located above the second gas injection port 131. Thus, when the second gas and the third gas are injected from the nozzle device 100 at the same time, the space lower than the third gas injection port 132 and higher than the substrate W can be filled with the second gas. Therefore, the space surrounding the substrate W can be maintained in a clean and low-reactive environment, that is, a chemically stable environment.

(d) As described above, the nozzle upper position HP is the height position higher than the cup-upper positions of the outer cup 30A and the inner cup 30B. On the other hand, the nozzle lower position LP is a height position lower than the nozzle upper position HP and higher than the substrate W.

Here, the nozzle lower position LP is preferably set such that, when the second gas and the third gas are injected from the nozzle device 100 in the space above the substrate, at least part of the openings of the two gas injection ports (131, 132,) are opposite to the space higher than the upper end portions of the two cups (30A, 30B).

In this case, in a period during which the nozzle device 100 is present in the space above the substrate W, a flow of gas injected from at least part of the openings of the two gas injection ports (131, 132) blocks a flow of gas between the space higher than the upper end portions of the two cups (30A, 30B) and the space lower than the upper end portions of the two cups (30A, 30B). Thus, the space in the two cups (30A, 30B) is substantially sealed, and adherence of contaminants such as particles floating in the space surrounding the two cups (30A, 30B) to the substrate W is reduced.

6. Other Embodiments (a) In the substrate processing apparatus 1 according to the above-mentioned embodiment, in the pre-process for the drying process, an operation of moving the nozzle device 100 from the center of the substrate to the outer peripheral end of the substrate is performed while the substrate center to the substrate outer peripheral end portion while discharging the replacement liquid from the nozzle device 100 located at the nozzle upper position HP is performed. This operation is referred to as a first operation.

In the substrate processing apparatus 1 according to the above-mentioned embodiment, in the post-process for the drying process, an operation of lowering the nozzle device 100 from the nozzle upper position HP to the nozzle lower position LP while injecting the first gas toward the center WC of the substrate W is performed. Thereafter, an operation of moving the nozzle device 100 from the center of the substrate to the outer peripheral end of the substrate while injecting the first gas from the nozzle device 100 being located at the nozzle lower position LP is performed. This series of operations is referred to as a second operation.

As described above, each of the first operation and the second operation effectively functions to appropriately remove the rinse liquid remaining on the substrate W after the rinsing process from the substrate W. Therefore, in a case in which the first operation is performed in the pre-process for the drying process, the substrate processing apparatus 1 may be configured to remove the replacement liquid on the substrate W by an operation different from the second operation in the post-process for the drying process. As an operation different from the second operation, the substrate W is rotated at a high rotation speed without injection of gas to the substrate W in the post-process for the drying process, for example.

Further, in a case in which the second operation is performed in the post-process for the drying process, the substrate processing apparatus 1 may be configured to replace the rinse liquid on the substrate W with the replacement liquid by an operation different from the first operation in the pre-process for the drying process. As an operation different from the first operation, the replacement liquid is supplied only to the center WC of the rotating substrate W in the pre-process for the drying process, for example.

Figure 19:
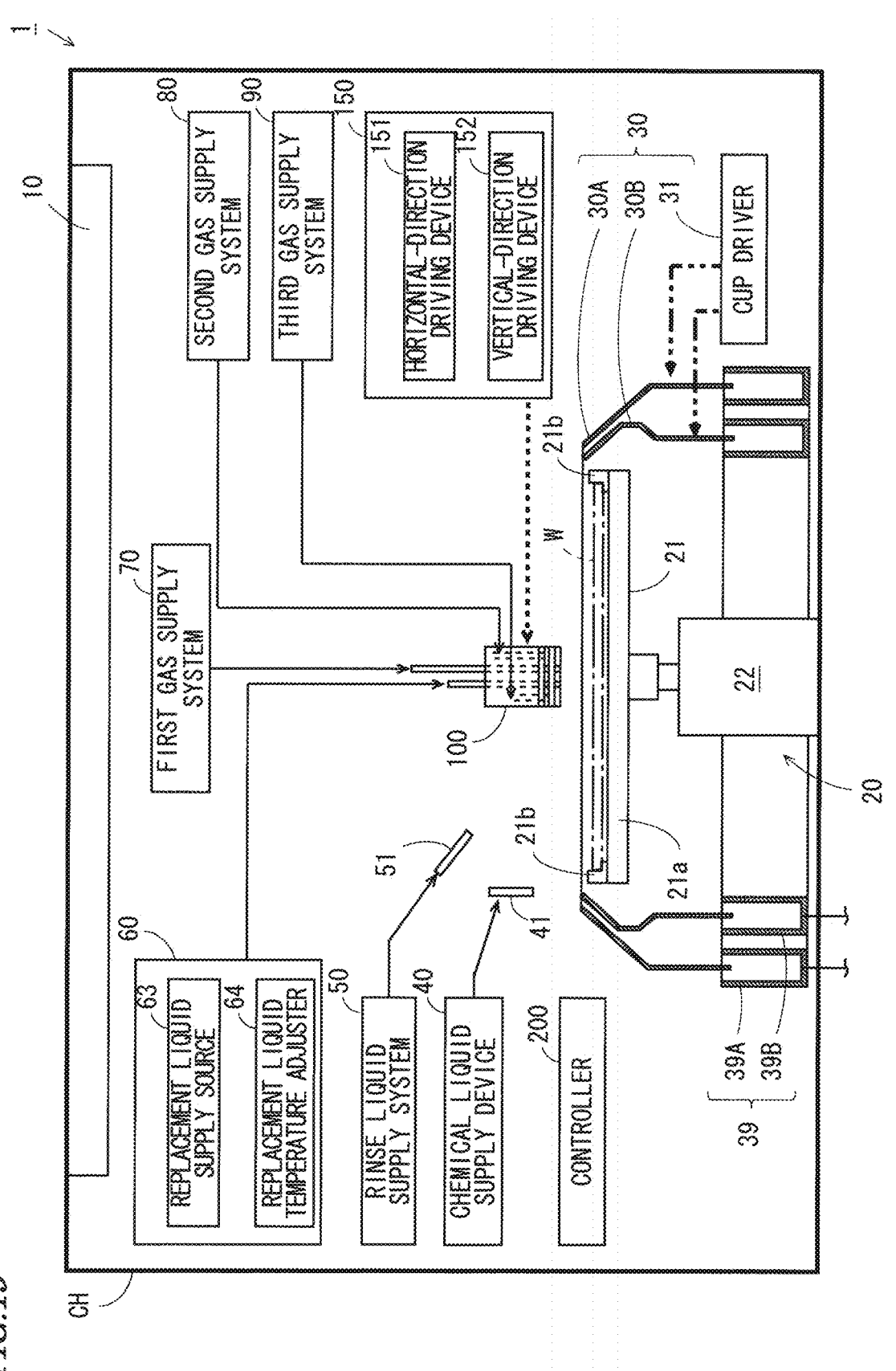
FIG. 19 is a schematic side view of the substrate processing apparatus according to another embodiment.

(b) In the substrate processing apparatus 1 according to the above-mentioned embodiment, the replacement liquid supply system 60 may be configured to be capable of supplying the replacement liquid heated to a predetermined temperature to the nozzle device 100. FIG. 19 is a schematic side view of the substrate processing apparatus 1 according to another embodiment. In regard to the configuration and the operation of the substrate processing apparatus 1 of FIG. 19, differences from the configuration and operation of the substrate processing apparatus 1 of FIG. 1 according to the above-mentioned embodiment will be described.

As shown in FIG. 19, in the substrate processing apparatus 1 of the present example, the replacement liquid supply system 60 includes a replacement liquid supply source 63 and a replacement liquid temperature regulator 64. The replacement liquid supply source 63 includes a tank or the like storing the replacement liquid, for example, and supplies the replacement liquid to the replacement liquid temperature regulator 64. The replacement liquid temperature regulator 64 heats the replacement liquid supplied from the replacement liquid temperature regulator 64 to a temperature higher than room temperature (25° C., for example). Specifically, the replacement liquid temperature regulator 64 adjusts the temperature of the replacement liquid to about 70° C. by heating the replacement liquid.

In this case, the replacement liquid at about 70° C. can be supplied from the nozzle device 100 from the replacement liquid supply system 60 in the pre-process for the drying process. Thus, the rinse liquid remaining on the substrate W after the rinsing process is replaced with the replacement liquid having a temperature higher than the room temperature. Further, the temperature of the substrate W can be maintained higher than the room temperature by supply of the replacement liquid having a temperature higher than the room temperature to the substrate W. This facilitates evaporation of the replacement liquid on the substrate W in the post-process for the drying process, and a period of time required for drying the substrate W can be shortened.

(c) While a mechanical chuck-type spin chuck that holds the outer peripheral end of the substrate W is used as the substrate holder 21 in the substrate processing apparatus 1 according to the above-described embodiment, the present disclosure is not limited to this. As the substrate holder 21, a suction-type spin chuck that holds the center portion of the lower surface of the substrate W by suction may be used.

(d) In the substrate processing apparatus 1 according to the above-mentioned embodiment, the cup upper position of the outer cup 30A is the same as the cup upper position of the inner cup 30B, and the cup lower position of the outer cup 30A and the cup lower position of the inner cup 30B are the same. However, the present disclosure is not limited to this. The cup upper position of the outer cup 30A and the cup upper position of the inner cup 30B may be different from each other. Further, the cup lower position of the outer cup 30A and the cup lower position of the inner cup 30B may be different from each other. Further, the outer cup 30A and the inner cup 30B may be configured to be independently movable in the vertical direction without interfering with each other. In this case, the nozzle upper position HP of the nozzle device 100 is preferably set to a position higher than the upper end portion of the outer cup 30A being located at the cup upper position and the upper end portion of the inner cup 30B being located at the cup upper position.

(e) In the post-process for the drying process according to the above-mentioned embodiment, in order to prevent interference between the nozzle device 100, and the outer cup 30A and the inner cup 30B, the outer cup 30A and the inner cup 30B are lowered from the cup upper position to the cup lower position during the horizontal movement of the nozzle device 100 being located at the nozzle lower position LP. However, the present disclosure is not limited to this.

In a case in which the nozzle device 100 does not interfere with the outer cup 30A or the inner cup 30B being located at the cup upper position even when the first gas is injected from the nozzle device 100 to the outer peripheral end of the substrate W for the reason that the size of the nozzle device 100 is sufficiently small, the outer cup 30A and the inner cup 30B may be held at the cup upper positions during the drying process.

In a case in which it is possible to inject the first gas to the entire area in which the pattern is formed on the substrate W because the nozzle device 100 moves horizontally in a range in which the nozzle device 100 does not interfere with the outer cup 30A or the inner cup 30B located at the cup upper position, the range of horizontal movement of the nozzle device 100 may be limited. Alternatively, in a case in which it is possible to sufficiently dry the entire substrate W because the nozzle device 100 moves horizontally in a range in which the nozzle device 100 does not interfere with the outer cup 30A or the inner cup 30B located at the cup upper position, the range of horizontal movement of the nozzle device 100 may be limited. Here, the limitation of the range of horizontal movement of the nozzle device 100 refers to the horizontal movement of the nozzle device 100 in a range in which the nozzle device 100 is moved from the center of the substrate to a position located farther inward than the outer peripheral end of the substrate by a certain distance. In these cases, the outer cup 30A and the inner cup 30B may be held at the cup upper position in the period of the drying process.

(f) While the nozzle device 100 according to the above-mentioned embodiment has the second gas injection port 131 and the third gas injection port 132 formed in the outer peripheral surface 130, the present disclosure is not limited to this. One of the second gas injection port 131 and the third gas injection port 132 does not have to be formed.

7. Correspondences Between Constituent Elements in Claims and Parts in Preferred Embodiments In the following paragraphs, non-limiting examples of correspondences between various elements recited in the claims below and those described above with respect to various preferred embodiments of the present disclosure are explained. As each of various elements recited in the claims, various other elements having configurations or functions described in the claims can be also used.

In the above-mentioned embodiment, the substrate processing apparatus 1 is an example of a substrate processing apparatus, the rinse liquid remaining on the substrate W after the rinsing process is an example of a residual liquid, the substrate holding device 20 is an example of a substrate holder, the replacement liquid discharge port 62 is an example of a liquid discharger, the first gas injection port 72 is an example of a first gas injector, the second gas injection port 131 is an example of a second gas injector, and the nozzle device 100 is an example of a nozzle device.

Further, the replacement liquid is an example of a processing liquid, the first gas is an example of a first gas, the second gas is an example of a second gas, the replacement liquid supply system 60, the first gas supply system 70, the second gas supply system 80 and the third gas supply system 90 are examples of a fluid supply system, the nozzle upper position HP is an example of an upper position, the nozzle lower position LP is an example of a lower position, the nozzle movement device 150 is an example of a relative movement device, and the controller 200 is an example of a controller.

Further, the inner cup 30B is an example of a processing cup, the third gas injection port 132 is an example of a third gas injector, the third gas is an example of a third gas, the outer peripheral surface 130 of the nozzle body 101 is an example of an outer peripheral surface, and the replacement liquid temperature regulator 64 is an example of a temperature regulator.

Further, the control of the substrate processing apparatus 1 corresponding to the operations in regard to the entire post-process for the drying process is an example of gas replacement control. Further, as shown in FIG. 14, the control of the substrate processing apparatus 1 that is executed when the nozzle device 100 located at the nozzle upper position HP is moved in the horizontal direction from the outer peripheral end to the center of the substrate in the post process for the drying process is an example of first gas replacement control. Further, as shown in FIGS. 15 and 16, the control of the substrate processing apparatus 1 that is executed when the nozzle device 100 is lowered from the nozzle upper position HP to the nozzle lower position LP while the first gas is injected toward the center WC of the substrate W is an example of second gas replacement control. Further, as shown in FIGS. 17 and 18, the control of the substrate processing apparatus 1 that is executed when the nozzle device 100 is moved horizontally from the center to the outer peripheral end of the substrate while the first gas is injected is an example of third gas replacement control.

Further, the control of the substrate processing apparatus 1 corresponding to the operations in regard to the entire pre-process for the drying process is an example of liquid replacement control. Further, as shown in FIG. 10, the control of the substrate processing apparatus 1 when the nozzle device 100 located at the nozzle upper position HP is moved in the horizontal direction from the waiting position to the center of the substrate in the pre-process for the drying process is an example of first liquid replacement control. Further, as shown in FIGS. 11 to 13, the control of the substrate processing apparatus 1 that is executed when the nozzle device 100 is moved horizontally from the center to the outer peripheral end of the substrate while the replacement liquid is injected is an example of second liquid replacement control.

8. Overview of Embodiments (Item 1) A substrate processing apparatus according to item 1 that removes, from a substrate, a residual liquid remaining on the substrate after pattern formation, includes a substrate holder that holds and rotates the substrate about an axis extending in a vertical direction, a nozzle device having a liquid discharger, a first gas injector and a second gas injector, a fluid supply system that supplies a processing liquid having a surface tension lower than that of the residual liquid, a first gas and a second gas to the nozzle device, a relative movement device that moves the nozzle device having one attitude relative to the substrate between an upper position that is higher than the substrate held by the substrate holder by a predetermined distance and a lower position that is lower than the upper position and higher than the substrate, and moves the nozzle device having the one attitude in a horizontal direction relative to the substrate, and a controller, wherein the liquid discharger, with the nozzle device having the one attitude, is formed to downwardly discharge the processing liquid supplied from the fluid supply system, the first gas injector, with the nozzle device having the one attitude, is formed to downwardly inject the first gas supplied from the fluid supply system, the second gas injector, with the nozzle device having the one attitude and being arranged in a space above the substrate held by the substrate holder, is formed to radially inject the second gas supplied from the fluid supply system toward an outer peripheral end of the substrate in plan view, and the controller controls the substrate holder such that the substrate held by the substrate holder is rotated, executes liquid replacement control for controlling the fluid supply system and the relative movement device such that, with the residual liquid present on the substrate held by the substrate holder, the processing liquid is discharged onto the substrate from the liquid discharger of the nozzle device, after the liquid replacement control, executes first gas replacement control for controlling the relative movement device such that, with the processing liquid present on the substrate, the nozzle device is located at the upper position and the first gas injector is opposite to a center of the substrate, after the first gas replacement control, executes second gas replacement control for controlling the fluid supply system and the relative movement device such that the nozzle device is lowered from the upper position to the lower position while the first gas and the second gas are respectively injected from the first gas injector and the second gas injector, and after the second gas replacement control, executes the third gas replacement control for controlling the fluid supply system and the relative movement device such that the nozzle device located at the lower position is moved from a center toward the outer peripheral end of the substrate while the first gas and the second gas are respectively injected from the first gas injector and the second gas injector.

In the substrate processing apparatus, the residual liquid on the substrate is replaced with the processing liquid by the liquid replacement control. Thereafter, due to the first gas replacement control, the nozzle device is arranged at the upper position, and the first gas injector is opposite to the center of the substrate. In this state, due to the second gas replacement control, gas is injected downwardly from the first gas injector of the nozzle device. The nozzle device is lowered from the upper position to the lower position while gas is maintained injected downwardly from the first gas injector. At this time, a degree of impact generated when the first gas injected from the first gas injector collides with the substrate increases gradually as the nozzle device is moved from the upper position to the lower position. Therefore, as compared to a case in which the injection of the first gas is started with the nozzle device located at the lower position, a change in impact applied to the processing liquid on the substrate is alleviated. Therefore, splashing of the processing liquid caused by collision of the first gas with the substrate is reduced. This suppresses a decrease in cleanliness of the substrate due to re-adherence of the processing liquid splashed from the substrate to the substrate.

On the substrate on which the pattern is formed, a plurality of grooves having a depth in the direction orthogonal to the substrate are formed. With the above-mentioned configuration, because the third gas replacement control is executed, it is possible to inject the first gas to the substrate in the direction orthogonal to the substrate over the wide range of the upper surface of the substrate. Thus, the processing liquid remaining in the grooves on the substrate is more efficiently replaced by the first gas. Therefore, the processing liquid remaining in the grooves is smoothly removed, and the substrate is dried. During this drying, because the processing liquid removed from the substrate has a surface tension lower than that of the residual liquid, the pattern formed on the substrate is unlikely to be damaged by the surface tension. As a result, it is possible to appropriately remove the residual liquid remaining on the substrate W after the pattern formation from the substrate.

Further, during the second gas replacement control and the third gas replacement control, the second gas is injected from the second gas injector. In this case, at a position above the substrate, a flow of the second gas is formed to spread in a planar shape in the direction parallel to the upper surface of the substrate. This suppresses fall of particles that are splashed at a position higher than the second gas injector onto the substrate. This suppresses a decrease in cleanliness of the substrate after drying.

(Item 2) The substrate processing apparatus according to item 1, may further include a processing cup that is formed to surround the substrate held by the substrate holder in plan view, and receives a processing liquid splashed from the substrate in a case in which the processing liquid is supplied to the substrate held by the substrate holder, wherein the upper position may be a position higher than an upper end portion of the processing cup in a case in which the processing liquid is supplied to the substrate held by the substrate holder.

In this case, when injection of the first gas is started by the second gas replacement control, the distance between the nozzle device and the substrate can be largely ensured. Thus, impact generated by collision of the first gas with the substrate is more sufficiently alleviated, and splashing of the processing liquid is more sufficiently reduced.

(Item 3) The substrate processing apparatus according to item 2, wherein the nozzle device may further have a third gas injector, the fluid supply system may further supply a third gas to the nozzle device, and the third gas injector may be located farther upwardly than the second gas injector, and may be formed to radially inject the third gas supplied from the fluid supply system toward an outer peripheral end of the substrate in plan view with the nozzle device having the one attitude and being arranged in a space above the substrate held by the substrate holder.

In this case, a flow of the third gas injected from the third gas injector blocks the flow of gas between the space higher than the third gas injector and the space lower than the third gas injector. Thus, contaminants such as particles are prevented from falling onto the substrate from the space higher than the third gas injector. Further, with the second gas replacement control and the third gas replacement control, the space lower than the third gas injector and higher than the substrate can be filled with the second gas. Therefore, it is possible to maintain the space surrounding the substrate in a clean and poorly reactive environment, that is, a chemically stable environment, by using an appropriate gas as the second gas.

(Item 4) The substrate processing apparatus according to item 3, wherein the nozzle device may have a cylindrical outer peripheral surface extending in the vertical direction while having the one attitude, each of the second gas injector and the third gas injector may have an annular opening extending in a circumferential direction of the outer peripheral surface, and at least part of the opening of the second gas injector and the opening of the third gas injector may be formed to be directed toward a space higher than an upper end portion of the processing cup during the third gas replacement control.

In this case, a flow of gas injected from at least part of the opening of the second gas injector and the opening of the third gas injector blocks the flow of gas between the space higher than the upper end portion of the processing cup and the space lower than the upper end portion of the processing cup. Thus, the space in the processing cup is substantially sealed, and adherence of contaminants such as particles floating in the space surrounding the processing cup to the substrate is reduced.

(Item 5) The substrate processing apparatus according to any one of items 1 to 4, wherein the liquid replacement control may include first liquid replacement control for controlling the relative movement device such that, with the residual liquid present on the substrate held by the substrate holder, the nozzle device is located at the upper position and the liquid discharger is opposite to a center of the substrate, and second liquid replacement control for controlling the fluid supply system and the relative movement device after the first liquid replacement control such that the nozzle device located at the upper position is moved from a center toward the outer peripheral end of the substrate while the processing liquid is discharged from the liquid discharger.

In this case, the processing liquid can be discharged in the direction orthogonal to the substrate from the center to the peripheral portion of the rotating substrate. Further, the processing liquid collides with the obverse surface of the substrate with high energy by being discharged from the upper position as compared to a case in which the processing liquid is discharged from the lower position. Thus, the residual liquid remaining on the substrate is more efficiently replaced with the processing liquid. As a result, it is possible to more appropriately remove the residual liquid remaining on the substrate from the substrate.

(Item 6) The substrate processing apparatus according to any one of items 1 to 5, wherein the fluid supply system may include a temperature regulator that regulates a temperature of the processing liquid supplied to the nozzle device at a temperature higher than a room temperature.

In this case, during liquid replacement control, the residual liquid remaining on the substrate is replaced with the processing having a temperature higher than the room temperature.

(Item 7) A substrate processing apparatus according to item 7 that removes, from a substrate, a residual liquid remaining on the substrate after pattern formation, includes a substrate holder that holds and rotates the substrate about an axis extending in a vertical direction, a nozzle device having a liquid discharger, a first gas injector and a second gas injector, a fluid supply system that supplies a processing liquid having a surface tension lower than that of the residual liquid, a first gas and a second gas to the nozzle device, a relative movement device that moves the nozzle device having one attitude relative to the substrate between an upper position that is higher than the substrate held by the substrate holder by a predetermined distance and a lower position that is lower than the upper position and higher than the substrate, and moves the nozzle device having the one attitude in a horizontal direction relative to the substrate, and a controller, wherein the liquid discharger, with the nozzle device having the one attitude, is formed to downwardly discharge the processing liquid supplied from the fluid supply system, the first gas injector, with the nozzle device having the one attitude, is formed to downwardly inject the first gas supplied from the fluid supply system, the second gas injector, with the nozzle device having the one attitude and being arranged in a space above the substrate held by the substrate holder, is formed to radially inject the second gas supplied from the fluid supply system toward an outer peripheral end of the substrate in plan view, and the controller controls the substrate holder such that the substrate held by the substrate holder is rotated, executes first liquid replacement control for controlling the relative movement device such that, with the residual liquid present on the substrate held by the substrate holder, the nozzle device is located at the upper position and the liquid discharger is opposite to a center of the substrate, executes second liquid replacement control for controlling the fluid supply system and the relative movement device after the first liquid replacement control such that the nozzle device located at the upper position is moved from a center toward the outer peripheral end of the substrate while the processing liquid is discharged from the liquid discharger, and executes gas replacement control for controlling the fluid supply system and the relative movement device after the second liquid replacement control such that the first gas is injected onto the substrate from the first gas injector of the nozzle device while the second gas is injected from the second gas injector of the nozzle device, with the processing liquid present on the substrate held by the substrate holder.

In the substrate process of supplying the processing liquid to the rotating substrate, the processing cup for receiving the processing liquid splashed from the substrate is used. During usage of the processing cup, the processing cup is held at the height position similar to the height position of the substrate while being close to the outer peripheral end of the substrate. Therefore, when the nozzle device is located close to the substrate, the processing cup and the nozzle device may interfere with each other.

In the substrate processing apparatus, with the first liquid replacement control, the nozzle device is arranged at the upper position, and the liquid discharger is opposite to the center of the substrate. Subsequently, due to the second liquid replacement control, the processing liquid is discharged to the substrate from the liquid discharger. Further, the nozzle device is moved from the center toward the outer peripheral end of the substrate. In this case, as compared to a case in which the nozzle device is located at the lower position, the nozzle device is held at the height position spaced apart from the substrate. Therefore, when the nozzle device is moved from the center toward the outer peripheral end of the substrate, the nozzle device and the processing cup are unlikely to interfere with each other.

Further, on the substrate after the pattern formation, a plurality of grooves having a depth in the direction orthogonal to the upper surface of the substrate are formed. With the above-mentioned configuration, due to the second liquid replacement control, it is possible to discharge the processing liquid in the direction orthogonal to the substrate over the wide range of the upper surface of the substrate. At this time, because being discharged from the upper position, the processing liquid collides with obverse surface of the substrate with high energy as compared to a case in which the processing liquid is discharged from the lower position. Therefore, the residual liquid remaining in the grooves on the substrate is more efficiently replaced with the processing liquid. Therefore, the residual liquid remaining in the grooves is smoothly removed.

After the second liquid replacement control, the processing liquid on the substrate is replaced with the first gas by the gas replacement control, and the substrate is dried. During this drying, because the processing liquid removed from the substrate has a surface tension lower than that of the residual liquid, damage to the pattern formed on the substrate caused by the surface tension is unlikely to occur. As a result, it is possible to appropriately remove the residual liquid remaining on the substrate after the pattern formation from the substrate.

Further, during the gas replacement control, the second gas is injected from the second gas injector. In this case, at a position above the substrate, a flow of the second gas is formed to spread in a planar shape in the direction parallel to the upper surface of the substrate. This suppresses fall of particles splashed at a position higher than the second gas injector onto the substrate. This suppresses a decrease in cleanliness of the substrate after drying.

(Item 8) The substrate processing apparatus according to item 7, may further include a processing cup that is formed to surround the substrate held by the substrate holder in plan view, and receives a processing liquid splashed from the substrate in a case in which the processing liquid is supplied to the substrate held by the substrate holder, wherein the upper position may be a position higher than an upper end portion of the processing cup in a case in which the processing liquid is supplied to the substrate held by the substrate holder.

In this case, when the processing liquid is discharged by the second liquid replacement control, the long distance between the nozzle device and the substrate can be ensured. Thus, it is possible to cause the processing liquid discharged from the liquid discharger to collide with the obverse surface of the substrate with high energy. Therefore, the residual liquid remaining in the grooves is smoothly removed.

(Item 9) The substrate processing apparatus according to item 8, wherein the nozzle device may further have a third gas injector, the fluid supply system may further supply a third gas to the nozzle device, and the third gas injector may be located farther upwardly than the second gas injector, and may be formed to radially inject the third gas supplied from the fluid supply system toward an outer peripheral end of the substrate in plan view, with the nozzle device having the one attitude and being located in a space above the substrate held by the substrate holder.

In this case, a flow of the third gas injected from the third gas injector blocks the flow of gas between the space higher than the third gas injector and the space lower than the third gas injector. Thus, contaminants such as particles are prevented from falling onto the substrate from the space higher than the third gas injector. Further, with the second gas replacement control and the third gas replacement control, the space lower than the third gas injector and higher than the substrate can be filled with the second gas. Therefore, it is possible to maintain the space surrounding the substrate in a clean and poorly reactive environment, that is, a chemically stable environment, by using an appropriate gas as the second gas.

(Item 10) The substrate processing apparatus according to item 9, wherein the nozzle device may have a cylindrical outer peripheral surface extending in the vertical direction while having the one attitude, each of the second gas injector and the third gas injector may have an annular opening extending in a circumferential direction of the outer peripheral surface, and at least part of the opening of the second gas injector and the opening of the third gas injector may be formed to be directed toward a space higher than an upper end portion of the processing cup during the gas replacement control.

In this case, a flow of gas injected from at least part of the opening of the second gas injector and the opening of the third gas injector blocks the flow of gas between the space higher than the upper end portion of the processing cup and the space lower than the upper end portion of the processing cup. Thus, the space in the processing cup is substantially sealed, and adherence of contaminants such as particles floating in the space surrounding the processing cup to the substrate is reduced.

(Item 11) A substrate processing method according to item 11 of removing a residual liquid remaining on a substrate after pattern formation using a nozzle device, wherein the nozzle device has a liquid discharger, a first gas injector and a second gas injector, the liquid discharger, with the nozzle device having one attitude, is formed to downwardly discharge a processing liquid supplied to the nozzle device, the first gas injector, with the nozzle device having the one attitude, is formed to downwardly inject a first gas supplied to the nozzle device, the second gas injector, with the nozzle device having the one attitude and being arranged in a space above the substrate held by the substrate holder, is formed to radially inject a second gas supplied to the nozzle device toward an outer peripheral end of the substrate in plan view, the processing liquid has a surface tension lower than that of the residual liquid, and the substrate processing method includes holding the substrate using the substrate holder and rotating the held substrate about an axis extending in a vertical direction, a liquid replacement step of, with the residual liquid present on the substrate held by the substrate holder, discharging the processing liquid onto the substrate from the liquid discharger by arranging the nozzle device above the substrate and supplying the processing liquid to the nozzle device, a first gas replacement step of, after the liquid replacement step, arranging the nozzle device at an upper position higher than the substrate by a predetermined distance such that the first gas injector is opposite to a center of the substrate with the processing liquid present on the substrate, a second gas replacement step of, after the first gas replacement step, lowering the nozzle device to a lower position lower than the upper position and higher than the substrate while respectively injecting the first gas and the second gas from the first gas injector and the second gas injector by supplying the first gas and the second gas to the nozzle device, and a third gas replacement step of, after the second gas replacement step, moving the nozzle device located at the lower position from a center to the outer peripheral end of the substrate while respectively injecting the first gas and the second gas from the first gas injector and the second gas injector by supplying the first gas and the second gas to the nozzle device.

With the substrate processing method, the residual liquid on the substrate is replaced with the processing liquid in the liquid replacement step. Thereafter, in the first gas replacement step, the nozzle device is arranged at the upper position, and the first gas injector is opposite to the center of the substrate. In this state, in the second gas replacement step, gas is injected downwardly from the first gas injector of the nozzle device. The nozzle device is lowered from the upper position to the lower position while gas is maintained injected downwardly from the first gas injector. At this time, a degree of impact generated when the first gas injected from the first gas injector collides with the substrate increases gradually as the nozzle device is moved from the upper position to the lower position. Therefore, as compared to a case in which the injection of the first gas is started with the nozzle device located at the lower position, a change in impact applied to the processing liquid on the substrate is alleviated. Therefore, splashing of the processing liquid caused by collision of the first gas with the substrate is reduced. This suppresses a decrease in cleanliness of the substrate due to re-adherence of the processing liquid splashed from the substrate to the substrate.

On the substrate on which the pattern is formed, a plurality of grooves having a depth in the direction orthogonal to the substrate are formed. With the above-mentioned method, because the third gas replacement step is executed, it is possible to inject the first gas in the direction orthogonal to the substrate over a wide range of the upper surface of the substrate. Thus, the processing liquid remaining in the grooves on the substrate is more efficiently replaced by the first gas. Therefore, the processing liquid remaining in the grooves is smoothly removed, and the substrate is dried. During this drying, because the processing liquid removed from the substrate has a surface tension lower than that of the residual liquid, damage to the pattern formed on the substrate caused by the surface tension is unlikely to occur. As a result, it is possible to appropriately remove the residual liquid remaining on the substrate after the pattern formation from the substrate.

Further, in the second gas replacement step and the third gas replacement step, the second gas is injected from the second gas injector. In this case, at a position above the substrate, a flow of the second gas is formed to spread in a planar shape in the direction parallel to the upper surface of the substrate. This suppresses fall of particles splashed at a position higher than the second gas injector onto the substrate. This suppresses a decrease in cleanliness of the substrate after drying.

(Item 12) A substrate processing method according to item 12 of removing a residual liquid remaining on a substrate after pattern formation from the substrate using a nozzle device, wherein the nozzle device has a liquid discharger, a first gas injector and a second gas injector, the liquid discharger, with the nozzle device having one attitude, is formed to downwardly discharge a processing liquid supplied to the nozzle device, the first gas injector, with the nozzle device having the one attitude, is formed to downwardly inject a first gas supplied to the nozzle device, the second gas injector, with the nozzle device having the one attitude and being arranged in a space above the substrate held by the substrate holder, is formed to radially inject a second gas supplied to the nozzle device toward an outer peripheral end of the substrate in plan view, the processing liquid has a surface tension lower than that of the residual liquid, and the substrate processing method includes holding the substrate using the substrate holder and rotating the held substrate about an axis extending in a vertical direction, a first liquid replacement step of arranging the nozzle device having the one attitude to an upper position higher than the substrate by a predetermined distance such that the liquid discharger is opposite to a center of the substrate with the residual liquid present on the substrate held by the substrate holder, a second liquid replacement step of, after the first liquid replacement step, moving the nozzle device located at the upper position from a center toward the outer peripheral end of the substrate while discharging the processing liquid from the liquid discharger by supplying the processing liquid to the nozzle device, and a gas replacement step of, after the second liquid replacement step, with the processing liquid present on the substrate, arranging the nozzle device above the substrate and injecting the first gas to the substrate from the first gas injector by supplying the first gas to the nozzle device while injecting the second gas from the second gas injector by supplying the second gas to the nozzle device.

In the substrate process of supplying the processing liquid to the rotating substrate, the processing cup for receiving the processing liquid splashed from the substrate is used. During usage of the processing cup, the processing cup is held at the height position similar to the height position of the substrate while being close to the outer peripheral end of the substrate. Therefore, when the nozzle device is located close to the substrate, the processing cup and the nozzle device may interfere with each other.

With the substrate processing method, in the first liquid replacement step, the nozzle device is arranged at the upper position, and the liquid discharger is opposite to the center of the substrate. Subsequently, in the second liquid replacement step, the processing liquid is discharged to the substrate from the liquid discharger. Further, the nozzle device is moved from the center toward the outer peripheral end of the substrate. In this case, as compared to a case in which the nozzle device is located at a position lower than the upper position, the nozzle device is held at the height position spaced apart from the substrate. Therefore, when the nozzle device is moved from the center toward the outer peripheral end of the substrate, the nozzle device and the processing cup are unlikely to interfere with each other.

Further, on the substrate after the pattern formation, a plurality of grooves having a depth in the direction orthogonal to the upper surface of the substrate are formed. With the above-mentioned configuration, because the second liquid replacement step is executed, it is possible to discharge the processing liquid in the direction orthogonal to the substrate over the wide range of the upper surface of the substrate. At this time, because being discharged from the upper position, the processing liquid collides with the obverse surface of the substrate with high energy as compared to a case in which the processing liquid is discharged from a position lower than the upper position. Therefore, the residual liquid remaining in the grooves on the substrate is more efficiently replaced with the processing liquid. Therefore, the residual liquid remaining in the grooves is smoothly removed.

After the second liquid replacement step, the processing liquid on the substrate is replaced with the first gas in the gas replacing step, and the substrate is dried. During this drying, because the processing liquid removed from the substrate has a surface tension lower than that of the residual liquid, damage to the pattern formed on the substrate caused by the surface tension is unlikely to occur. As a result, it is possible to appropriately remove the residual liquid remaining on the substrate after the pattern formation from the substrate.

Further, during the gas replacement step, the second gas is injected from the second gas injector. In this case, at a position above the substrate, a flow of the second gas is formed to spread in a planar shape in the direction parallel to the upper surface of the substrate. This suppresses fall of particles splashed at a position higher than the second gas injector onto the substrate. This suppresses a decrease in cleanliness of the substrate after drying.

With the substrate processing apparatus and the substrate processing method according to the above-mentioned embodiments, the residual liquid can be efficiently removed during drying for the substrate. Therefore, because wasteful consumption of the processing liquid is suppressed, it is not necessary to prepare a large amount of the processing liquid. Therefore, it is possible to contribute to a reduction in pollution of a global environment caused by the processing liquid.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

We claim:

1. A substrate processing apparatus that removes, from a substrate, a residual liquid remaining on the substrate after pattern formation, comprising:

a substrate holder that holds and rotates the substrate about an axis extending in a vertical direction;

a nozzle device having a liquid discharger, a first gas injector and a second gas injector;

a fluid supply system that supplies a processing liquid having a surface tension lower than that of the residual liquid, a first gas and a second gas to the nozzle device;

a relative movement device that moves the nozzle device having one attitude relative to the substrate between an upper position that is higher than the substrate held by the substrate holder by a predetermined distance and a lower position that is lower than the upper position and higher than the substrate, and moves the nozzle device having the one attitude in a horizontal direction relative to the substrate; and a controller, wherein the liquid discharger, with the nozzle device having the one attitude, is formed to downwardly discharge the processing liquid supplied from the fluid supply system, the first gas injector, with the nozzle device having the one attitude, is formed to downwardly inject the first gas supplied from the fluid supply system, the second gas injector, with the nozzle device having the one attitude and being arranged in a space above the substrate held by the substrate holder, is formed to radially inject the second gas supplied from the fluid supply system toward an outer peripheral end of the substrate in plan view, and the controller controls the substrate holder such that the substrate held by the substrate holder is rotated, executes liquid replacement control for controlling the fluid supply system and the relative movement device such that, with the residual liquid present on the substrate held by the substrate holder, the processing liquid is discharged onto the substrate from the liquid discharger of the nozzle device, after the liquid replacement control, executes first gas replacement control for controlling the relative movement device such that, with the processing liquid present on the substrate, the nozzle device is located at the upper position and the first gas injector is opposite to a center of the substrate, after the first gas replacement control, executes second gas replacement control for controlling the fluid supply system and the relative movement device such that the nozzle device is lowered from the upper position to the lower position while the first gas and the second gas are respectively injected from the first gas injector and the second gas injector, and after the second gas replacement control, executes third gas replacement control for controlling the fluid supply system and the relative movement device such that the nozzle device located at the lower position is moved from a center toward the outer peripheral end of the substrate while the first gas and the second gas are respectively injected from the first gas injector and the second gas injector.

2. The substrate processing apparatus according to claim 1, further comprising a processing cup that is formed to surround the substrate held by the substrate holder in plan view, and receives a processing liquid splashed from the substrate in a case in which the processing liquid is supplied to the substrate held by the substrate holder, wherein the upper position is a position higher than an upper end portion of the processing cup in a case in which the processing liquid is supplied to the substrate held by the substrate holder.

3. The substrate processing apparatus according to claim 2, wherein the nozzle device further has a third gas injector, the fluid supply system further supplies a third gas to the nozzle device, and the third gas injector is located farther upwardly than the second gas injector, and is formed to radially inject the third gas supplied from the fluid supply system toward an outer peripheral end of the substrate in plan view with the nozzle device having the one attitude and being arranged in a space above the substrate held by the substrate holder.

4. The substrate processing apparatus according to claim 3, wherein the nozzle device has a cylindrical outer peripheral surface extending in the vertical direction while having the one attitude, each of the second gas injector and the third gas injector has an annular opening extending in a circumferential direction of the outer peripheral surface, and at least part of the opening of the second gas injector and the opening of the third gas injector is formed to be directed toward a space higher than an upper end portion of the processing cup during the third gas replacement control.

5. The substrate processing apparatus according to claim 1, wherein the liquid replacement control includes first liquid replacement control for controlling the relative movement device such that, with the residual liquid present on the substrate held by the substrate holder, the nozzle device is located at the upper position and the liquid discharger is opposite to a center of the substrate, and second liquid replacement control for controlling the fluid supply system and the relative movement device after the first liquid replacement control such that the nozzle device located at the upper position is moved from a center toward the outer peripheral end of the substrate while the processing liquid is discharged from the liquid discharger.

6. The substrate processing apparatus according to claim 1, wherein the fluid supply system includes a temperature regulator that regulates a temperature of the processing liquid supplied to the nozzle device at a temperature higher than a room temperature.

7. A substrate processing apparatus that removes, from a substrate, a residual liquid remaining on the substrate after pattern formation, comprising:

a substrate holder that holds and rotates the substrate about an axis extending in a vertical direction;

a nozzle device having a liquid discharger, a first gas injector and a second gas injector;

a fluid supply system that supplies a processing liquid having a surface tension lower than that of the residual liquid, a first gas and a second gas to the nozzle device;

a relative movement device that moves the nozzle device having one attitude relative to the substrate between an upper position that is higher than the substrate held by the substrate holder by a predetermined distance and a lower position that is lower than the upper position and higher than the substrate, and moves the nozzle device having the one attitude in a horizontal direction relative to the substrate; and a controller, wherein the liquid discharger, with the nozzle device having the one attitude, is formed to downwardly discharge the processing liquid supplied from the fluid supply system, the first gas injector, with the nozzle device having the one attitude, is formed to downwardly inject the first gas supplied from the fluid supply system, the second gas injector, with the nozzle device having the one attitude and being arranged in a space above the substrate held by the substrate holder, is formed to radially inject the second gas supplied from the fluid supply system toward an outer peripheral end of the substrate in plan view, and the controller controls the substrate holder such that the substrate held by the substrate holder is rotated, executes first liquid replacement control for controlling the relative movement device such that, with the residual liquid present on the substrate held by the substrate holder, the nozzle device is located at the upper position and the liquid discharger is opposite to a center of the substrate, executes second liquid replacement control for controlling the fluid supply system and the relative movement device after the first liquid replacement control such that the nozzle device located at the upper position is moved from a center toward the outer peripheral end of the substrate while the processing liquid is discharged from the liquid discharger, and executes gas replacement control for controlling the fluid supply system and the relative movement device after the second liquid replacement control such that the first gas is injected onto the substrate from the first gas injector of the nozzle device while the second gas is injected from the second gas injector of the nozzle device, with the processing liquid present on the substrate held by the substrate holder.

8. The substrate processing apparatus according to claim 7, further comprising a processing cup that is formed to surround the substrate held by the substrate holder in plan view, and receives a processing liquid splashed from the substrate in a case in which the processing liquid is supplied to the substrate held by the substrate holder, wherein the upper position is a position higher than an upper end portion of the processing cup in a case in which the processing liquid is supplied to the substrate held by the substrate holder.

9. The substrate processing apparatus according to claim 8, wherein the nozzle device further has a third gas injector, the fluid supply system further supplies a third gas to the nozzle device, and the third gas injector is located farther upwardly than the second gas injector, and is formed to radially inject the third gas supplied from the fluid supply system toward an outer peripheral end of the substrate in plan view, with the nozzle device having the one attitude and being located in a space above the substrate held by the substrate holder.

10. The substrate processing apparatus according to claim 9, wherein the nozzle device has a cylindrical outer peripheral surface extending in the vertical direction while having the one attitude, each of the second gas injector and the third gas injector has an annular opening extending in a circumferential direction of the outer peripheral surface, and at least part of the opening of the second gas injector and the opening of the third gas injector is formed to be directed toward a space higher than an upper end portion of the processing cup during the gas replacement control.

* * * * *